(12) United States Patent
Lim et al.

(10) Patent No.: US 11,901,902 B2
(45) Date of Patent: Feb. 13, 2024

(54) INTEGRATED CIRCUIT INCLUDING FLIP-FLOP AND COMPUTING SYSTEM FOR DESIGNING THE INTEGRATED CIRCUIT

(71) Applicant: Samsung Electronics Co., Ltd., Suwon-si (KR)

(72) Inventors: Seungman Lim, Siheung-si (KR); Minsu Kim, Hwaseong-si (KR); Ahreum Kim, Daegu (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 17/696,086

(22) Filed: Mar. 16, 2022

(65) Prior Publication Data

US 2022/0385277 A1   Dec. 1, 2022

(30) Foreign Application Priority Data

May 25, 2021   (KR) .................. 10-2021-0066827
Mar. 7, 2022   (KR) .................. 10-2022-0028935

(51) Int. Cl.
*H03K 3/02* (2006.01)
*H03K 3/037* (2006.01)
*H03K 17/687* (2006.01)
*H03K 3/3562* (2006.01)

(52) U.S. Cl.
CPC ......... *H03K 3/0372* (2013.01); *H03K 3/3562* (2013.01); *H03K 17/6872* (2013.01)

(58) Field of Classification Search
CPC .......... H03K 3/02; H03K 3/027; H03K 3/037; H03K 3/0372; H03K 3/0375; H03K 3/353; H03K 3/356; H03K 3/356008; H03K 3/356017; H03K 3/356052; H03K 3/356086; H03K 3/356104; H03K 3/356121; H03K 3/356147; H03K 3/3562; H03K 3/35625
See application file for complete search history.

(56) References Cited

U.S. PATENT DOCUMENTS

| | | | |
|---|---|---|---|
| 6,798,249 B2 | 9/2004 | Wong et al. |
| 7,117,412 B2 | 10/2006 | Ogawa et al. |
| 8,122,413 B2 | 2/2012 | Hom et al. |
| 8,866,509 B1 | 10/2014 | Fu et al. |
| 9,583,493 B2 | 2/2017 | Kim et al. |
| 9,641,161 B1 | 5/2017 | Liu et al. |
| 9,685,934 B2 | 6/2017 | Kornilov et al. |

(Continued)

FOREIGN PATENT DOCUMENTS

KR   10-2018-0033490 A   4/2018

*Primary Examiner* — Long Nguyen
(74) *Attorney, Agent, or Firm* — Harness, Dickey & Pierce, P.L.C.

(57) ABSTRACT

An integrated circuit includes a flip-flop configured to operate in synchronization with a clock signal. The flip-flop includes a multiplexer configured to output an inverted signal of a scan input signal to a first node based on a scan enable signal, or the multiplexer configured to output an inverted signal of a data input signal or a signal having a first level to a first node based on a reset input signal, a master latch configured to latch the signal output through the first node, and to output the latched signal, and a slave latch configured to latch an output signal of the master latch and to output the latched output signal of the master latch.

16 Claims, 18 Drawing Sheets

(56) References Cited

U.S. PATENT DOCUMENTS

| | | | |
|---|---|---|---|
| 9,985,610 B2 | 5/2018 | Kim et al. | |
| 10,868,524 B2 * | 12/2020 | Lee ................ | G01R 31/318541 |
| 2014/0328115 A1 * | 11/2014 | Bartling ............. | H03K 3/35625 |
| | | | 327/203 |
| 2020/0097634 A1 | 3/2020 | Chen et al. | |
| 2020/0195237 A1 * | 6/2020 | Lee ................ | G01R 31/318541 |

* cited by examiner

| SE | RN | DI | SI | O1 | |
|---|---|---|---|---|---|
| 0 | 1 | 0 | 0 | 1 | NORMAL OPERATION MODE |
| | | 0 | 1 | 1 | |
| | | 1 | 0 | 0 | |
| | | 1 | 1 | 0 | |
| | 0 | 0 | 0 | 1 | RESET OPERATION MODE |
| | | 0 | 1 | 1 | |
| | | 1 | 0 | 1 | |
| | | 1 | 1 | 1 | |
| 1 | 0 or 1 | 0 | 0 | 1 | SCAN TEST MODE |
| | | 0 | 1 | 0 | |
| | | 1 | 0 | 1 | |
| | | 1 | 1 | 0 | |

INTEGRATED CIRCUIT INCLUDING FLIP-FLOP AND COMPUTING SYSTEM FOR DESIGNING THE INTEGRATED CIRCUIT

CROSS-REFERENCE TO RELATED APPLICATION

This application is based on and claims priority under 35 U.S.C. § 119 to Korean Patent Application Nos. 10-2021-0066827, filed on May 25, 2021, and 10-2022-0028935, filed on Mar. 7, 2022, in the Korean Intellectual Property Office, the disclosure of each of which is incorporated by reference herein in its entirety.

BACKGROUND

Inventive concepts relate to a flip-flop, and more particularly, to a flip-flop including a reset function, and/or a method of designing an integrated circuit including the flip-flop.

Semiconductor integrated circuits with improved performance and high integration have increased the number of flip-flops included therein. A flip-flop may be used as a data storage device, and these data storage devices may be used to store a state. A flip-flop may be an electronic circuit capable of storing and holding one or more bits information, and may a basic element of a sequential logic circuit. The flip-flop may be implemented with a plurality of transistors, and thus, the signal routing complexity between the plurality of transistors may increase as the semiconductor integrated circuits become highly integrated.

SUMMARY

Inventive concepts provide a flip-flop including a multiplexer to which a reset input is applied, and having an efficient reset structure, and/or a method of designing an integrated circuit including the flip-flop.

According some example embodiments, an integrated circuit includes a first flip-flop configured to operate in synchronization with a clock signal. The first flip-flop includes a multiplexer configured to output and inverted signal of a scan input signal to a first node based on a scan enable signal, or the multiplexer configured to output an inverted signal of a data input signal or a signal having a first level to a first node based on a reset input signal, a master latch configured to latch the signal output through the first node, and to output the latched signal, and a slave latch configured to latch an output signal of the master latch and to output the latched output signal of the master latch.

According to some example embodiments, an integrated circuit includes a plurality of power lines each extending in a first direction, a first flip-flop cell between first and second power lines adjacent to each other among the plurality of power lines and configured to latch one of a first data input signal or a scan input signal and to output a first output signal, the outputting the first output signal based on a clock signal and a scan enable signal, the first flip-flop cell configured to reset the first output signal, the resetting the first output signal based on a reset input signal, and a second flip-flop cell between the second power line and a third power line adjacent to the second power line and configured to latch one of a second data input signal or the scan input signal and to generate a second output signal, the generating the second output signal based on the clock signal and the scan enable signal, the second flip-flop cell configured to reset the second output signal, the resetting the second output signal based on the reset input signal. The first flip-flop cell includes a first selection block configured to at least one of output one selected from among the first data input signal and the scan input signal, or to output a signal having a first level, the outputting of the first selection block based on the reset input signal, and a first latch block configured to generate at least one of the first output signal or reset the first output signal the generating by latching an output signal of the first selection block.

According to some example embodiments, an integrated circuit includes a plurality of power lines each extending in a first direction, apart from each other in a second direction perpendicular to the first direction, and arranged between first to fourth rows, first to fourth flip-flop cells respectively arranged in the first to fourth rows, and configured to latch one of a data input signal or a scan input signal, to generate an output signal based on a clock signal and a scan enable signal, and to reset the output signal based on a reset input signal, and a dummy region in any of the first to fourth rows. Each of the first to fourth flip-flop cells includes a selection block configured to at least one of output one selected from among the data input signal and the scan input signal, or to output a signal having a first level, the outputting of the selection block based on the reset input signal, and a latch block configured to latch an output signal of the selection block and generate the output signal or reset the output signal.

BRIEF DESCRIPTION OF THE DRAWINGS

Some example embodiments of the inventive concept will be more clearly understood from the following detailed description taken in conjunction with the accompanying drawings in which.

DETAILED DESCRIPTION OF SOME EXAMPLE EMBODIMENTS

Hereinafter, various example embodiments of inventive concepts will be described with reference to the accompanying drawings. Components that are the same or are in correspondence with each other are rendered the same reference symbols regardless of the figure number, and redundant explanations are omitted for brevity.

Figure 1:
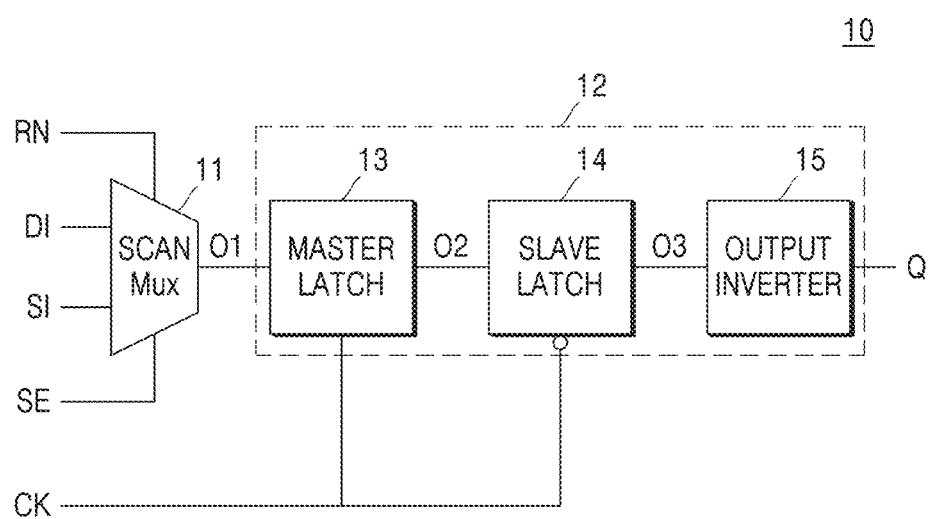
FIG. 1 is a block diagram of a flip-flop according to some example embodiments of inventive concepts.

FIG. 1 is a circuit diagram of a flip-flop 10 according to some example embodiments of inventive concepts.

Referring to FIG. 1, the flip-flop 10 may include a multiplexer 11 and a latch circuit 12. The latch circuit 12 may include a master latch 13, a slave latch 14, and an output inverter 15.

The multiplexer 11 may receive a scan enable signal SE, a scan input signal SI, a data input signal DI, and a reset input signal RN. The multiplexer 11 may output a first output signal O1 based on the scan input signal SI, based on the scan enable signal SE. The multiplexer 11 may output a first output signal O1 based on the data input signal DI or a first output signal O1 having a first level, based on the reset input signal RN. The first output signal O1 may maintain a first level based on the reset input signal RN. For example, the first output signal O1 may maintain a high level according to the reset input signal RN. Although it is described below that the first output signal O1 maintains a high level according to the reset input signal RN, the inventive concept is not limited thereto, and in some example embodiments, the first output signal O1 may maintain a low level according to the reset input signal RN. The first output signal O1 may maintain a constant level by the scan enable signal SE and the reset input signal RN. For example, the first output signal O1 may maintain a constant level (e.g. a high level or a low level) when the scan enable signal SE has a low level and the reset input signal RN has a low level.

The multiplexer 11 may maintain a high logic level of the first output signal O1 based on the reset input signal RN. By maintaining the high logic level of the first output signal O1, a final output signal Q of the flip-flop 10 may be reset to a low level. Thus, the flip-flop 10 may selectively operate in a normal operation mode, a scan test mode, or a reset operation mode by/based on the scan enable signal SE and the reset input signal RN. The multiplexer 11 may also be referred to as a mux, a scan mux, and/or a selection unit.

The master latch 13 may receive the first output signal O1 from the multiplexer 11. The master latch 13 may latch the first output signal O1 based on a clock signal CK (e.g. a true clock signal), and generate a second output signal O2 accordingly.

The slave latch 14 may receive the second output signal O2 from the master latch 13. The slave latch 14 may latch the second output signal O2 based on an inverted clock signal CKB provided by inverting the clock signal CK (e.g. a complimentary clock signal), and may generate a third output signal O3 accordingly. The clock signal CK of FIG. 1 is briefly illustrated for explanation, and it will be clearly understood by those skilled in the art that the clock signal CK of FIG. 1 does not mean a signal that controls the slave latch 14 not to operate when the master latch 13 operates. A specific embodiment in which the clock signal CK and the inverted clock signal CKB are input to the master latch 13 and the slave latch 14 may be described with FIGS. 4, 5A, and 5B to be described below.

The output inverter 15 may receive the third output signal O3 from the slave latch 14 and invert the third output signal O3, to thereby generate the output signal Q, which may be the final output signal of the flip-flop 10.

The flip-flop 10 may perform a reset function by using the multiplexer 11. The flip-flop 10 may receive the reset input signal RN through the multiplexer 11 and maintain the final output signal Q at a low level in response to the reset input signal RN. The flip-flop 10 may perform a reset function by using the multiplexer 11 including a reset transistor and implement a semiconductor device that is small in size. Hereinafter, a circuit diagram illustrating a multiplexer 11 including a reset transistor is described.

Figure 2A:
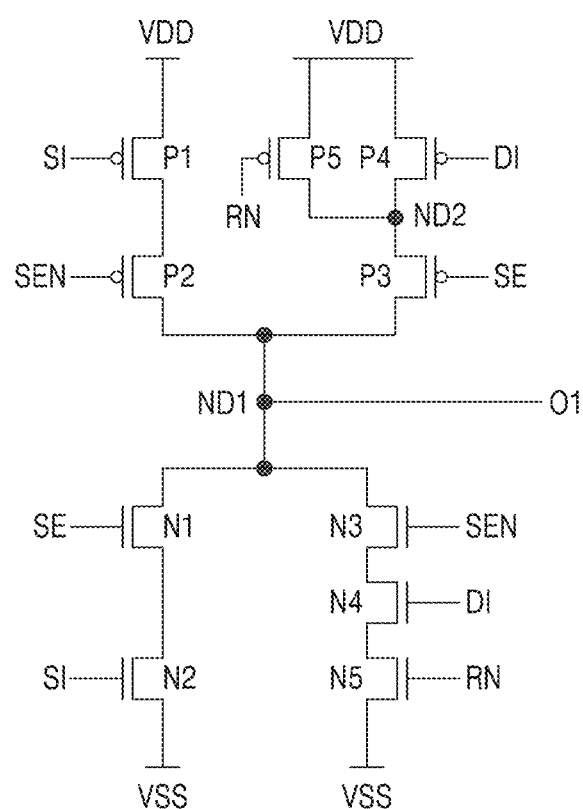
FIG. 2A to 2C are a circuit diagram of a multiplexer according to some example embodiments of inventive concepts.
Figure 2B:
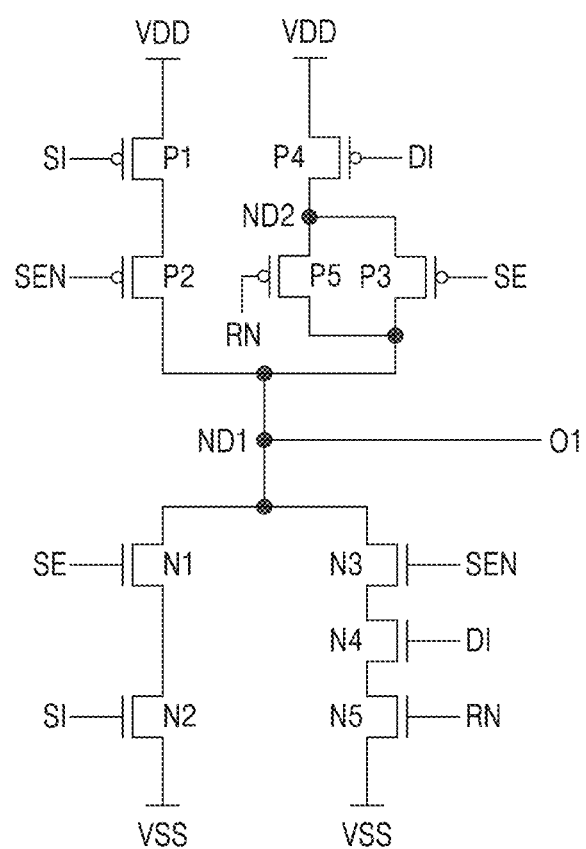
Figure 2C:
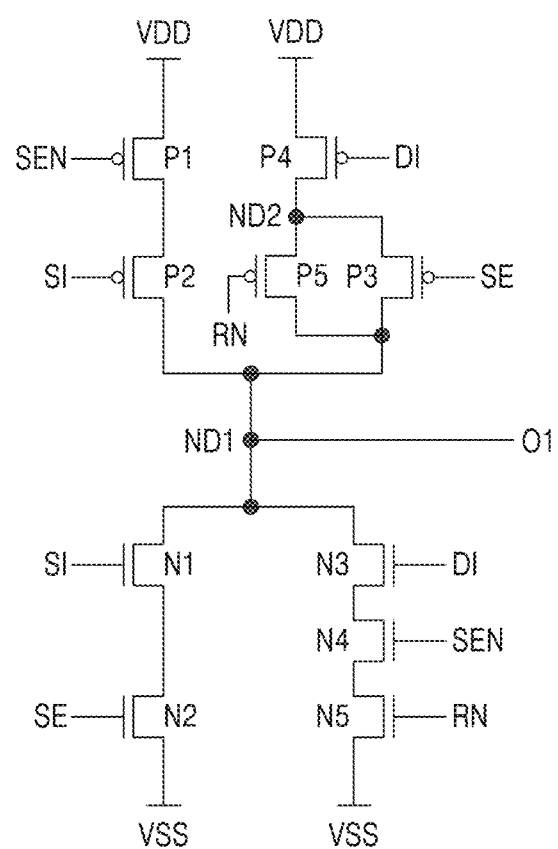

FIGS. 2A to 2C are a circuit diagram illustrating the multiplexer 11 according to some example embodiments of inventive concepts. In detail, the circuit diagrams of FIGS. 2A to 2C are diagrams for explaining various embodiments of the multiplexer 11 of FIG. 1. Hereinafter, it will be described with reference to FIG. 1 and overlapping description will be omitted.

Referring to FIGS. 2A to 2C, the multiplexer 11a, 11b, 11c may receive the scan enable signal SE, the scan input signal SI, the data input signal DI, and the reset input signal RN and output the first output signal O1 through a first node ND1.

The multiplexer 11a, 11b, 11c may include a plurality of transistors. As used herein, the plurality of transistors may have any structure. For example, the transistors may include a fin field-effect transistor (FinFET) formed by an active pattern extending in a fin shape and a gate electrode. Alternatively or additionally the transistors may include a multi-bridge channel FET (MBCFET™) formed by a plurality of nanosheets each extending in parallel to each other and a gate electrode. Alternatively or additionally the transistors may include a forksheet FET (ForkFET) having a structure, in which an n-type transistor and a p-type transistor are made closer to each other by separating nanosheets for p-type transistors and nanosheets for n-type transistors from each other by a dielectric wall. Alternatively or additionally, the transistors may also include a vertical FET (VFET) including a gate electrode surrounding source and drain areas apart from each other in a vertical direction in FIG. 2 and a channel area. Alternatively or additionally the transistors may include a bipolar junction transistor and other three-dimensional transistors, as well as a FET such as complementary FETs (CFETs), negative FETs (NCFETs), carbon nanotube (CNT) FETs, and/or the like For example, the multiplexer 11a, 11b, 11c may include first to fifth n-type FETs (NFETs) N1 to N5 and first to fifth p-type FETs (PFETs) P1 to P5.

Referring to FIG. 2A, the first NFET N1 and the second NFET N2 may be connected in series to each other between a node to which the ground voltage VSS is applied (hereinafter referred to as a "ground node") and the first node ND1. The first NFET N1 may receive the scan enable signal SE. The second NFET N2 may receive the scan input signal SI. A drain terminal of the second NFET N2 may be connected to a source terminal of the first NFET N1, and a source terminal of the second NFET N2 may be connected to the ground node.

The third to fifth NFETs N3 to N5 may be connected in series to each other between the ground node and the first node ND1. The third NFET N3 may receive an inverted scan enable signal SEN, which is provided by inverting the scan enable signal SE. The fourth NFET N4 may receive the data input signal DI. The fifth NFET N5 may receive the reset input signal RN. A drain terminal of the fourth NFET N4 may be connected to a source terminal of the third NFET N3, and a source terminal of the fourth NFET N4 may be connected to a drain terminal of the fifth NFET N5. One end of the fifth NFET N5 may be connected to the ground terminal. The fifth NFET N5 may also be referred to as "a reset NFET". Each of the first through fifth NFETs may be of the same, or of different, structure from one another; example embodiments are not limited thereto. Each of the first through fifth NFETs may have the same, or different, geometrical structure such as at least one of gate lengths, gate widths, oxide thicknesses, etc. and/or the same, or different, electrical properties such as at least one of threshold voltages, subthreshold swings, drive currents, etc.; example embodiments are not limited thereto.

The first PFET P1 and the second PFET P2 may be connected in series to each other between a power node and the first node ND1. The first PFET P1 may receive the scan input signal SI, and the second PFET P2 may receive the inverted scan enable signal SEN. A source terminal of the first PFET P1 may be connected to the power node, and a drain terminal of the first PFET P1 may be connected to a source electrode of the second PFET P2.

The third PFET P3 may be connected between the first node ND1 and a second node ND2 and may receive the scan enable signal SE. The fourth PFET P4 and the fifth PFET P5 may be connected in parallel to each other between a node to which the power voltage VDD is applied (hereinafter referred to as a "power node") and the second node ND2. The fourth PFET P4 may receive the data input signal DI. The fifth PFET P5 may receive the reset input signal RN. One end of each of the fourth PFET P4 and the fourth PFET P4 may be connected to the power node, and the other end may be connected to the second node ND2. The fifth PFET P5 may also be referred to as "a reset PFET". Each of the first through fifth PFETs may be of the same, or of different, structure from one another; example embodiments are not limited thereto. Each of the first through fifth PFETs may have the same, or different, geometrical structure such as at least one of gate lengths, gate widths, oxide thicknesses, etc. and/or the same, or different, electrical properties such as at least one of threshold voltages, subthreshold swings, drive currents, etc.; example embodiments are not limited thereto. The multiplexer 11a according to some example embodiments of inventive concepts includes the fourth NFET N4 and the fifth NFET N5 connected in series to each other, and may include the fourth PFET P4 and the fifth PFET P5 connected in parallel to each other.

However, the embodiment according to the present disclosure is not limited to FIG. 2A. For example, the third NFET N3 may receive the data input signal DI, and the fourth NFET N4 may receive the inverted scan enable signal SEN. In this case, the third PFET P3 may receive the data input signal DI, and the fourth PFET P4 may receive the scan enable signal SE.

Referring to FIG. 2B, unlike the multiplexer 11a of FIG. 2A, the third PFET P3 and the fifth PFET P5 may be connected in parallel between the first node ND1 and the second node ND2. The third PFET P3 may receive the scan enable signal SE, and the fifth PFET P5 may receive the reset input signal RN. The fourth PFET P4 is connected between the second node ND2 and the power node, and the fourth PFET P4 may receive the data input signal DI. The multiplexer 11b according to an exemplary embodiment of the present disclosure may include a fourth NFET N4 and a fifth NFET N5 connected in series with each other and a third PFET P3 and a fifth PFET P5 connected in parallel to each other.

However, the embodiment according to the present disclosure is not limited to FIG. 2B. For example, the third PFET P3 may receive the data input signal DI, and the fourth PFET P4 may receive the scan enable signal SE.

Referring to FIG. 2C, unlike the multiplexer 11a of FIG. 2B, the first NFET N1 may receive the scan input signal SI, the second NFET N2 may receive the scan enable signal SE, the third NFET N3 may receive the data input signal DI, and the fourth NFET N4 may receive the inverted scan enable signal SEN. In this case, the first PFET P1 may receive the scan enable signal SE, and the second PFET P2 may receive the scan input signal SI.

However, the embodiment according to the present disclosure is not limited to FIG. 2C. For example, in FIG. 2C, the third PFET P3 may receive the data input signal DI, and the fourth PFET P4 may receive the scan enable signal SE.

When the scan enable signal SE has a low level and the reset input signal RN has a low level, the multiplexer 11a, 11b, 11c of FIGS. 2A to 2C may maintain a high logic level for the first output signal O1 output through the first node ND1. Accordingly, a logic level of the final output signal Q of the flip-flop 10 may be reset to a low level. However, the present invention is not limited thereto, and in some example embodiments, the logic level of the first output signal O1 may be maintained at a low level. In the following drawings including FIG. 3, for convenience of description, the multiplexer 11a of FIG. 2A will be described as an example. And operations of the multiplexer 11a are described below with reference to FIG. 3.

Figures 3, 4:
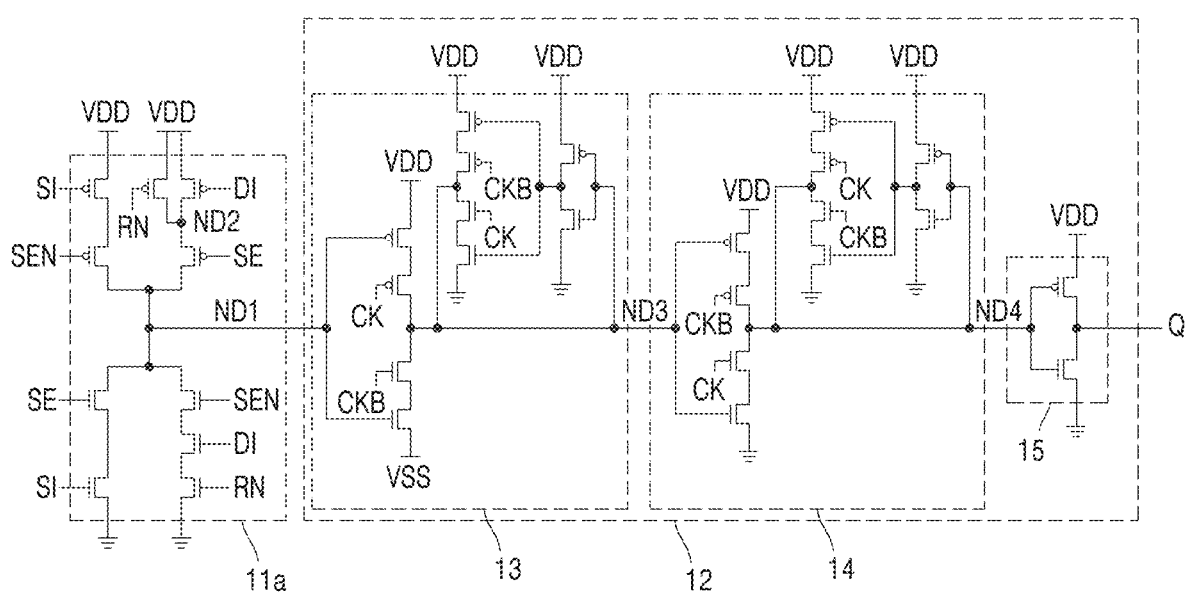
FIG. 3 is a truth table provided to describe an operation of a multiplexer, according to some example embodiments of inventive concepts.
FIG. 4 is a circuit diagram provided to describe a flip-flop according to some example embodiments of inventive concepts.

FIG. 3 is a truth table of an operation of a multiplexer 11a according to some example embodiments of inventive concepts. More specifically, it is a diagram for explaining the operation of the multiplexer 11a of FIG. 2A. Hereinafter, it will be described with reference to FIGS. 1 and 2A together, and overlapping descriptions will be omitted.

Referring to FIG. 3, when the scan enable signal SE has a high level, the multiplexer 11a may output a signal in which the scan input signal SI is inverted, as the first output signal O1. When the scan enable signal SE has a high level, the first output signal O1 may be generated regardless of the logic level of the reset input signal RN; for example the reset input signal RN may correspond to a "don't care" value in the truth table. As the multiplexer 11a outputs the signal in which scan input signal SI is inverted as the first output signal O1, the flip-flop 10 may operate in a scan test mode.

When the scan enable signal SE has a low level, the multiplexer 11a may output the first output signal O1 based on the reset input signal RN. When the scan enable signal SE has a low level and the reset input signal RN has a high level, the multiplexer 11a may output a signal in which the data input signal DI is inverted, as the first output signal O1. Thus, the flip-flop 10 may operate in a normal operation mode.

When the scan enable signal SE has a low level and the reset input signal RN has a low level, the multiplexer 11a may output the first output signal O1 having a high level, regardless of the logic level of the data input signal DI and the scan input signal SI; for example, the data input signal DI may be a "don't care" value in the truth table. Thus, the flip-flop 10 may operate in a reset operation mode. That is, when both the scan enable signal SE and the reset input signal RN have a low level, the first output signal O1 may have a high level regardless of the data input signal DI and the scan input signal SI, and based on this, the final output signal Q in FIG. 1 may be reset.

FIG. 4 is a circuit diagram illustrating a flip-flop 10 according to some example embodiments of inventive concepts.

Referring to FIG. 4, the flip-flop 10 may include a multiplexer 11a and a latch circuit 12. The latch circuit 12 may include a master latch 13, a slave latch 14, and an output inverter 15. The multiplexer 11a is described above with reference to FIGS. 2a and 3, and redundant descriptions thereof are omitted, and the master latch 13, the slave latch 14, and the output inverter 15 are mainly described below. The master latch 13 and the slave latch 14 shown in FIG. 4 are examples, and inventive concepts are not limited thereto. For example, the number of transistors and/or a type of transistor included in the master latch 13 and the slave latch 14 may be changed. Electrical properties and/or geometrical properties of each transistor included in the latch circuit may be the same, or may be different, from one another.

The master latch 13 may latch the first output signal (O1 in FIG. 1) output to the first node ND1 based on a clock signal CK and may generate a second output signal (O2 in FIG. 1) output to a third node ND3. The first output signal (O1 of FIG. 1) may be input to the gate terminal of the P-type transistor to which the power voltage VDD is applied to the source terminal, and a gate terminal of an N-type transistor to which a ground voltage (VSS) is applied to a source terminal. The P-type transistor to which the power voltage VDD is applied to the source terminal may be electrically connected to the third node ND3 through the P-type transistor operated based on the clock signal CK. And, the N-type transistor to which the ground voltage VSS is applied to the source terminal may be electrically connected to the third node ND3 through the N-type transistor operated based on the inverted clock signal CKB.

The slave latch 14 may latch the second output signal (O2 in FIG. 1) output to the third node ND3 based on a clock signal CK and may generate a third output signal (O3 in FIG. 1) output to a fourth node ND4. Alternatively or additionally, when the flip-flop 10 operates as a negative-edge flip-flop, the slave latch 14 may output the third output signal (O3 in FIG. 1) at a negative-edge of an inverted clock signal CKB.

The output inverter 15 may receive and invert the third output signal (O3 in FIG. 1) of the slave latch 14 output through the fourth node ND4 to thereby output an output signal Q, which may be a final output signal.

Although not shown, the flip-flop 10 may include a scan inverter that provides, to the multiplexer 11a, an inverted scan enable signal SEN provided by inverting the scan enable signal SE, and a clock inverter that provides, to the master latch 13 and the slave latch 14, the inverted clock signal CKB provided by inverting a clock signal CK. The scan inverter and the clock inverter will be described below with reference to FIG. 6.

Figure 5A:
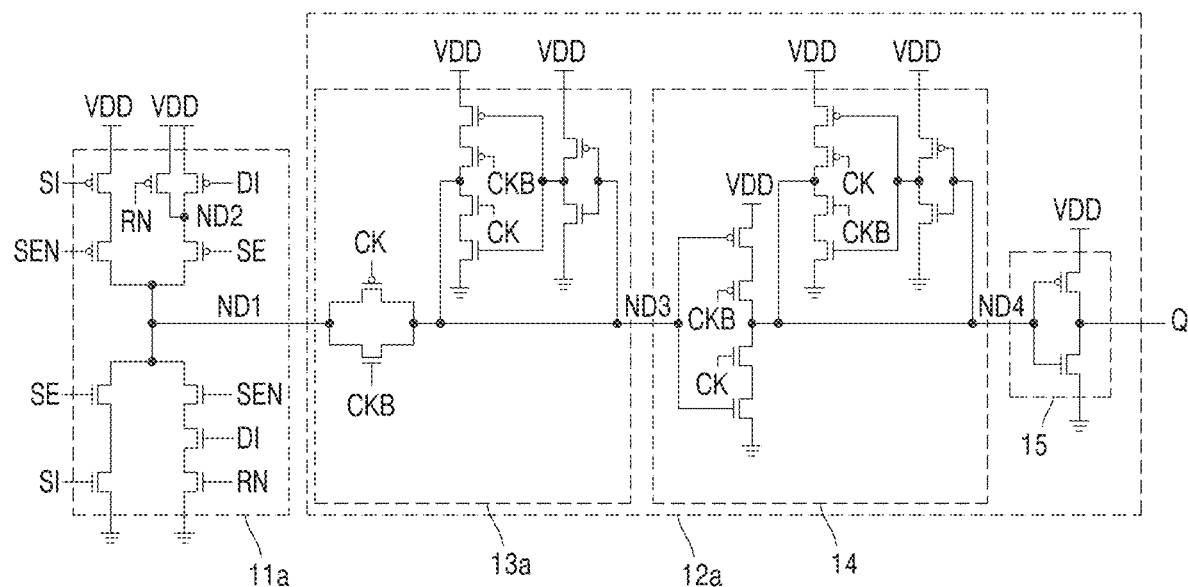
FIGS. 5A and 5B are a circuit diagram provided to describe a flip-flop according to some example embodiments of inventive concepts.
Figure 5B:
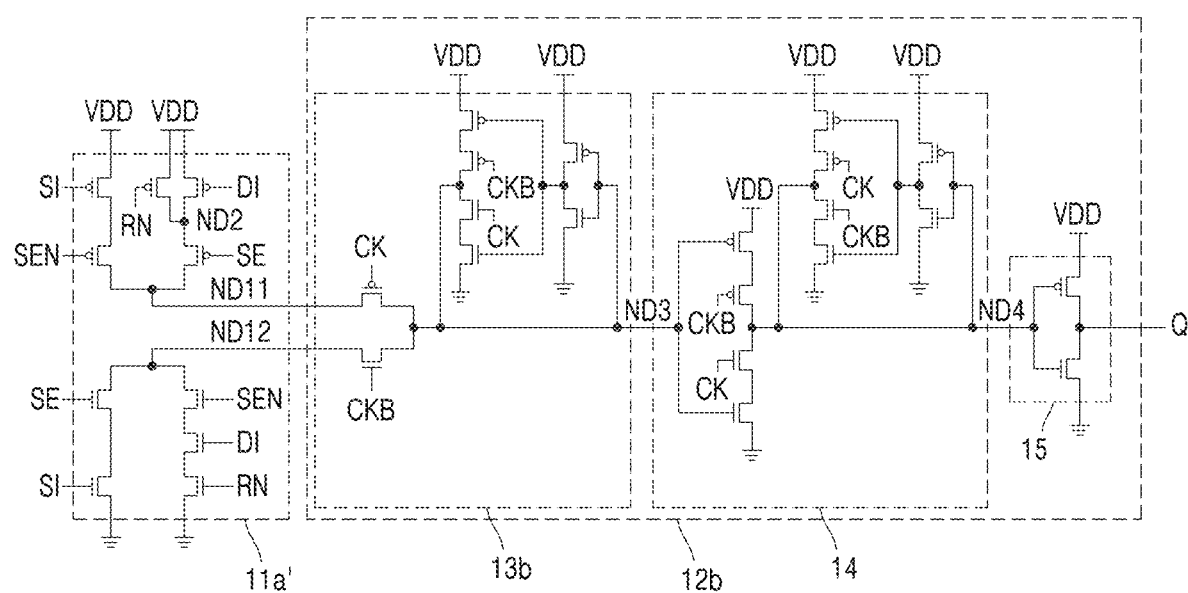

FIG. 5a is a circuit diagram illustrating a flip-flop 10a according to some example embodiments of inventive concepts. And FIG. 5b is a circuit diagram illustrating a flip-flop 10b according to some example embodiments of inventive concepts. FIGS. 5a and 5b show another embodiment of the flip-flop 10 shown in FIG. 4, and in more detail, are circuit diagrams for explaining another embodiment of the master latch 13 shown in FIG. 4. Hereinafter, differences from FIG. 4 will be mainly described, and overlapping descriptions will be omitted.

Referring to FIG. 5a, the flip-flop 10a may include a multiplexer 11a and a latch circuit 12a. The latch circuit 12a may include a master latch 13a, a slave latch 14, and an output inverter 15.

The master latch 13a may operate based on a clock signal CK and a inverted clock signal CKB. The master latch 13a may latch the first output signal (O1 in FIG. 1) output through the first node ND1, and may generate a second output signal (O2 in FIG. 1) output to a third node ND3. The first output signal O1 (see FIG. 1) may be input to a source terminal of the P-type transistor in which the clock signal CK is input to the gate terminal and a drain terminal of the N-type transistor in which the inverted clock signal CKB is input to the gate terminal. The first node ND1 and the third node ND3 may be electrically connected to each other through a P-type transistor in which a clock signal CK is input to the gate terminal and an N-type transistor in which an inverted clock signal CKB is input to the gate terminal.

Referring to FIG. 5b, the flip-flop 10b may include a multiplexer 11a' and a latch circuit 12b. The latch circuit 12b may include a master latch 13bL, a slave latch 14, and an output inverter 15.

The multiplexer 11a' may include an eleventh node ND11 and a twelfth node ND12 instead of the first node ND1 of the multiplexer 11 a of FIG. 4. The eleventh node ND11 is disposed between the second PFET (P2 in FIG. 2) and the third PFET (P3 in FIG. 2), and the twelfth node ND12 may be disposed between the first NFET (N1 in FIG. 2) and the third NFET (N3 in FIG. 2). The eleventh node ND11 and the twelfth node ND12 may each output a first output signal (O1 of FIG. 2). For example, the eleventh node ND11 may output the P-type first output signal output from the first to fifth PFETs (P1 to P5 of FIG. 2), and the twelfth node ND12 may output an N-type first output signal output from the first to fifth NFETs (N1 to N5 of FIG. 2).

The master latch 13b may operate based on a clock signal CK and a inverted clock signal CKB. The master latch 13b may latch the P-type first output signal and N-type first output signal output through the eleventh node ND11 and the twelfth node ND12, and may generate a second output signal (O2 in FIG. 1) output to a third node ND3. The P-type first output signal output through the eleventh node ND11 may be input to the source terminal of the P-type transistor to which the clock signal CK is inputted to the gate terminal, and the first N-type output signal output through the twelfth node ND12 may be input to the drain terminal of the N-type transistor to which the inverted clock signal CKB is input to the gate terminal. The eleventh node ND11 and the twelfth node ND12 may be electrically connected to the third node ND3 through the P-type transistor to which the clock signal CK is input to the gate terminal and the N-type transistor to which the inverted clock signal (CKB) is input to the gate terminal.

Figure 6:
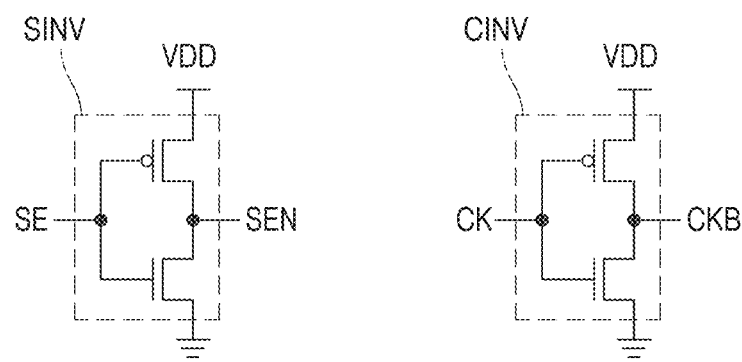
FIG. 6 is a circuit diagram provided to describe a scan inverter and a clock inverter according to some example embodiments of inventive concepts.

FIG. 6 shows circuit diagrams of a scan inverter SINV and a clock inverter CINV according to some example embodiments of inventive concepts. Hereinafter, description will be made with reference to FIG. 4, and overlapping description will be omitted.

Referring to FIG. 6, the scan inverter SINV and the clock inverter CINV may be included in a flip-flop 10 in FIG. 4.

The scan inverter SINV may include one NFET and one PFET and may receive a scan enable signal SE and output an inverted scan enable signal SEN that is provided by inverting the scan enable signal SE.

The clock inverter CINV may include one NFET and one PFET and may receive a clock signal CK and output an inverted clock signal CKB that is provided by inverting the clock signal CK. The NFET included in the clock inverter CINV may have the same or different features from the NFET included in the scan inverter SINV. The PFET included in the clock invert CINV may have the same or different features from the PFET included in the scan inverter SINV.

The scan inverter SINV and the clock inverter CINV may be included within the flip-flop 10. The scan inverter SINV and the clock inverter CINV may be included in at least one of the master latch 13 in FIG. 4 and the slave latch 14 in FIG. 4. Alternatively, the scan inverter SINV and the clock inverter CINV may be outside the flip-flop 10. In this case, the scan inverter SINV and the clock inverter CINV may be shared among a plurality of flip-flops 10. For example, the plurality of flip-flops 10 may commonly receive the inverted scan enable signal SEN from one scan inverter SINV and commonly receive the inverted clock signal CKB from one clock inverter CINV.

Figure 7:
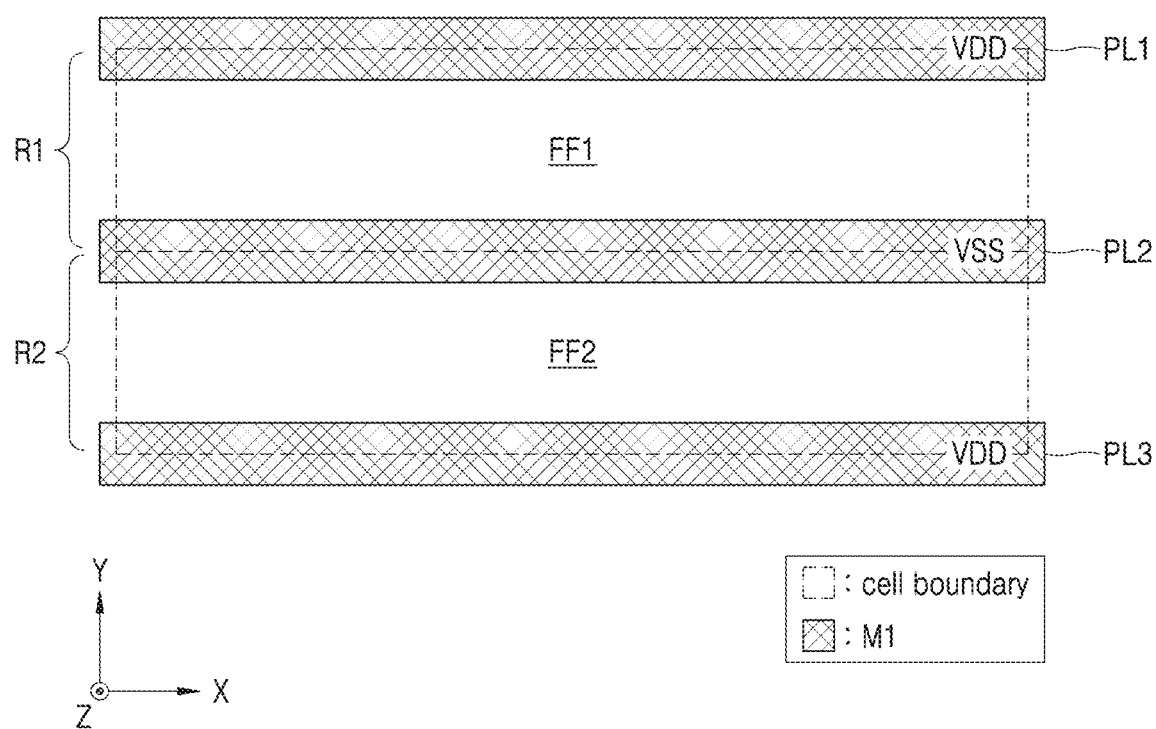
FIG. 7 is a layout diagram illustrating a flip-flop cell according to some example embodiments of inventive concepts.
Figure 8:
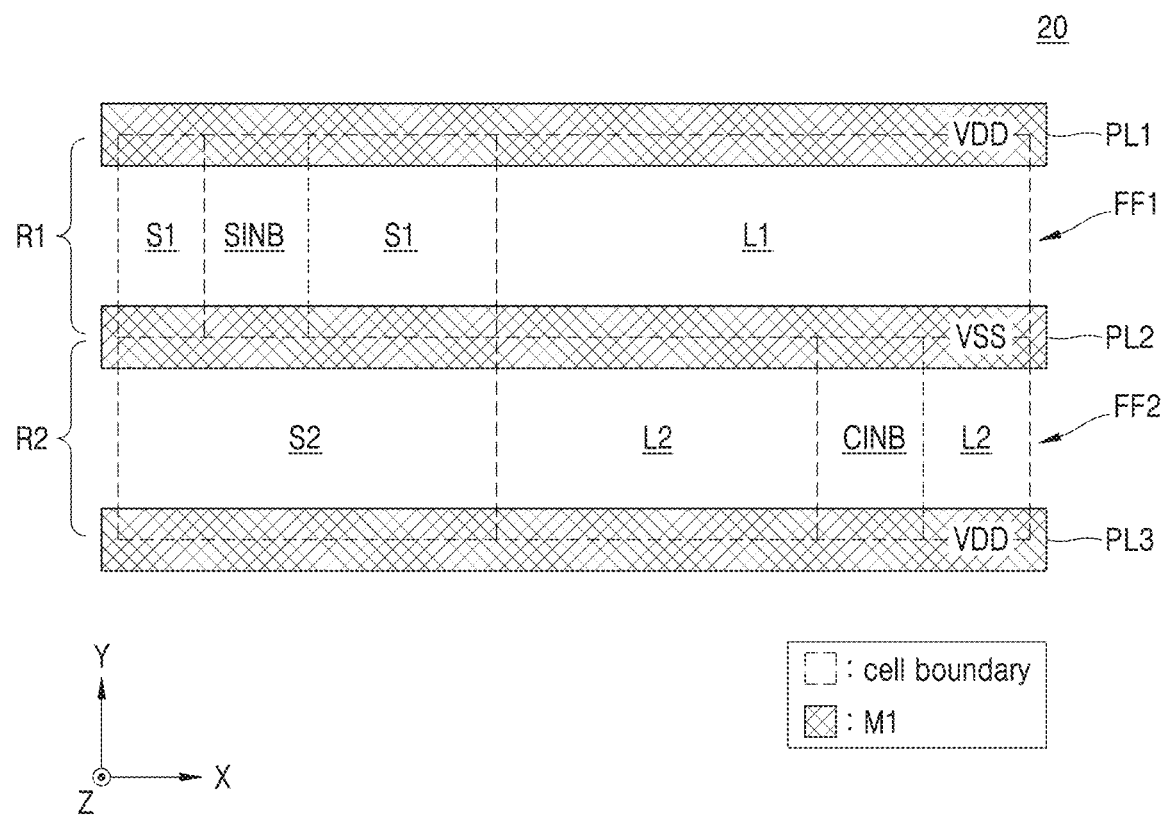
FIG. 8 is a layout diagram illustrating a flip-flop cell according to some example embodiments of inventive concepts.

FIGS. 7 and 8 are diagrams of a layout of an integrated circuit 20 according to some example embodiments of inventive concepts. Specifically, FIGS. 7 and 8 are plan views that show a layout of the integrated circuit 20 including a first flip-flop cell FF1 and a second flip-flop cell FF2, on a plane including an x-axis and a y-axis. As used herein, an x-axis direction and a y-axis direction may also be referred to as a first direction and a second direction, respectively, and a z-axis direction may also be referred to as a vertical direction. The plane including the x-axis and the y-axis may be referred to as a horizontal plane, and an element arranged in a relatively+z direction compared to another element may be understood as being above the other element, and an element arranged in a relatively-z direction compared to another element may be understood as being below the other element.

Referring to FIGS. 4 and 7, the integrated circuit 20 may include the first flip-flop cell FF1 and the second flip-flop cell FF2 that are arranged in a first row R1 and a second row R2, respectively.

Each of the first row R1 and the second row R2 may extend in the first direction, e.g. the x-axis direction. A cell is a unit of a layout included in an integrated circuit, may be designed to perform a specific (or, alternatively, pre-defined) function, and may also be referred to as a standard cell and/or an IP block. The integrated circuit 20 may include a plurality of various cells, and the cells may be aligned and arranged according to a plurality of rows.

First to third power lines PL1 to PL3 or power rails each extending in the first direction may be arranged at boundaries of the first row R1 and the second row R2. A power line for providing a positive supply voltage VDD and a power line for providing a negative supply voltage VS S may be alternately arranged. For example, the first power line PL1 and the third power line PL3 may include power lines for providing the positive supply voltage VDD, and the second power line PL2 may include a power line for providing the negative supply voltage VSS. The first flip-flop cell FF1 may be arranged between the first power line PL1 and the second power line PL2 that are adjacent to each other, and the second flip-flop cell FF2 may be arranged between the second power line PL2 and the third power line PL3 that are adjacent to each other.

Each of the first flip-flop cell FF1 and the second flip-flop cell FF2 may latch (store) the data input signal DI and/or the scan input signal SI based on the clock signal CK and the scan enable signal SE, may generate the output signal Q, and may reset the final output signal Q based on the reset input signal RN. Data input signals DI input to the first flip-flop cell FF1 and the second flip-flop cell FF2 may be the same as, or different from each other. For example, the data input signal DI input to the first flip-flop cell FF1 may include a first data input signal, and the data input signal DI input to the second flip-flop cell FF2 may include a second data input signal. The first flip-flop cell FF1 and the second flip-flop cell FF2 may each include a cell corresponding to the flip-flop 10 described above with reference to FIGS. 1 and 4. Thus, each of the first flip-flop cell FF1 and the second flip-flop cell FF2 may include the multiplexer 11a, the master latch 13, the slave latch 14, and the output inverter 15. A configuration of the first flip-flop cell FF1 and the second flip-flop cell FF2 will be described below with reference to FIG. 8. The first flip-flop cell FF1 and the second flip-flop cell FF2 may have the same components and connections, e.g. may have the same structure, as each other; however, example embodiments are not limited thereto.

When FIG. 8 is described with reference to FIGS. 4 and 6, the first flip-flop cell FF1 may include a selection block S1 and a latch block L1, and the second flip-flop cell FF2 may include a selection block S2 and a latch block L2. The first flip-flop cell FF1 may include a layout in which the selection block S1 and the latch block L1 are sequentially arranged, and the second flip-flop cell FF2 may include a layout in which the selection block S2 and the latch block L2 are sequentially arranged. The selection block of the first flip-flop cell FF1 may be referred to as a first selection block S1, and the latch block of the first flip-flop cell FF1 may be referred to as a first latch block L1. The selection block of the second flip-flop cell FF2 may be referred to as a second selection block S2, and the latch block of the second flip-flop cell FF2 may be referred to as a second latch block L2.

As used herein, a block may refer to a layout corresponding to a simple logic gate, a complex logic gate, a latch, a combinatorial logic unit, and/or the like. Thus, the first and second selection blocks S1 and S2 may refer to a layout corresponding to the multiplexer 11a, and the first and second latch blocks L1 and L2 may refer to a layout corresponding to the master latch 13, the slave latch 14, and the output inverter 15.

The first and second selection blocks S1 and S2 may output a data input signal and/or a scan input signal based on the received scan enable signal SE. The first and second selection blocks S1 and S2 may output a signal having a constant level based on the scan enable signal SE and the reset input signal RN.

The first and second latch blocks L1 and L2 may latch output signal of the first and second selection blocks S1 and S2 and may generate an output signal, e.g. a final output signal. The first and second selection blocks S1 and S2 may output a signal having a constant level based on the scan enable signal SE and the reset input signal RN, to thereby reset the final output signal of the first and second latch blocks L1 and L2.

A scan inverter block SINB may be inserted between the first selection blocks S1 in a first row R1. The scan inverter block SINB may include a layout corresponding to the scan inverter SINV. A clock inverter block CINB may be inserted between the second latch blocks L2 in a second row R2. The clock inverter block CINB may refer to a layout corresponding to the clock inverter CINV. An arrangement of the scan inverter block SINB and the clock inverter block CINB is not limited thereto, and in some example embodiments, the scan inverter block SINB and the clock inverter block CINB may be arranged in the same row. In some example embodiments, the scan inverter block SINB may not be inserted between the first selection blocks S1, but may be arranged between the first selection block S1 and the first latch block L1.

The first flip-flop cell FF1 and the second flip-flop cell FF2 may share the scan inverter block SINB and the clock inverter block CINB with each other. For example, the first flip-flop cell FF1 and the second flip-flop cell FF2 may commonly receive output signals from the scan inverter block SINB and the clock inverter block CINB. Thus, a size of the integrated circuit 20 may be reduced.

Figure 9:
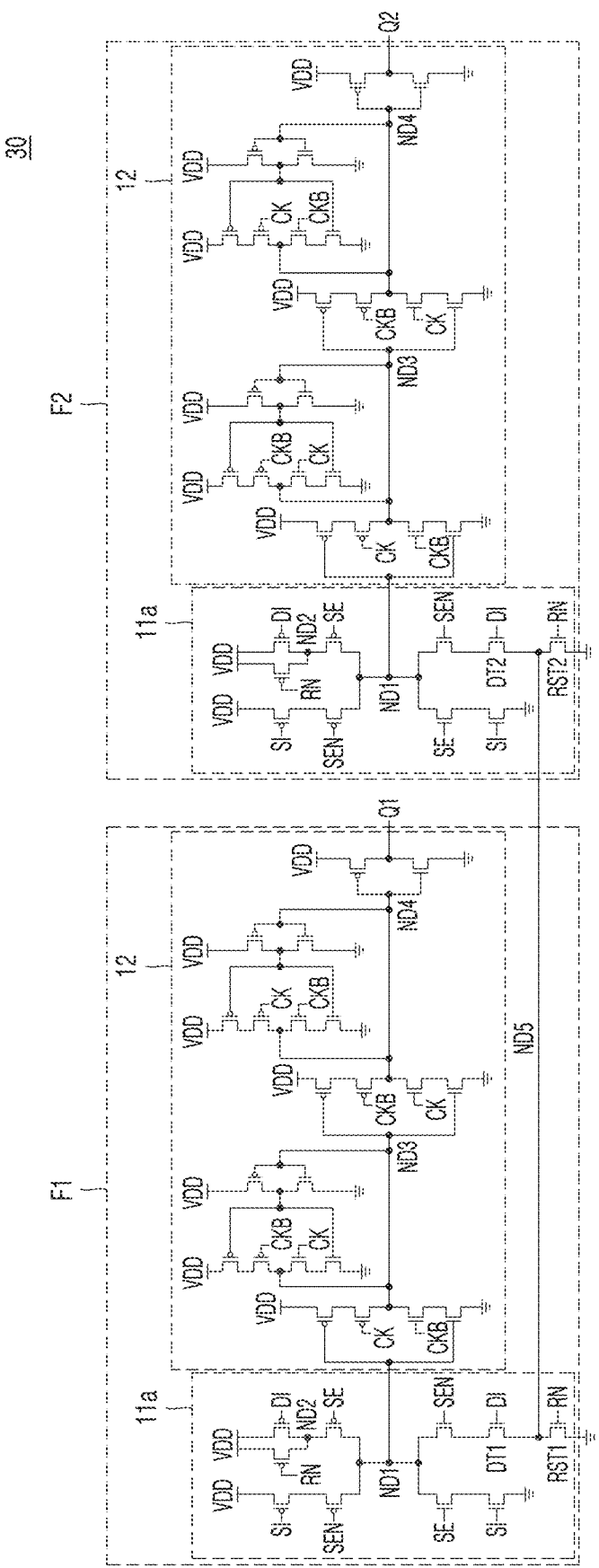
FIG. 9 is a circuit diagram illustrating a flip-flop cell according to some example embodiments of inventive concepts.

FIG. 9 is a circuit diagram illustrating flip-flops according to some example embodiments of inventive concepts. For example, FIG. 9 shows two-bit/2-bit flip-flops as compared with FIG. 4, and each of the flip-flops may correspond to the flip-flop 10 in FIG. 4. The reset NFETs (N5 of FIG. 2) included in each of the 2-bit flip-flops F1 and F2 of FIG. 9 may be electrically connected to each other through the fifth node ND5.

Referring to FIG. 9, an integrated circuit 30 may include a first flip-flop F1 and a second flip-flop F2. The first flip-flop F1 and the second flip-flop F2 may respectively correspond to the first flip-flop cell FF1 and the second flip-flop cell FF2 described with reference to FIG. 7 or 8.

The first flip-flop F1 may include a first data NFET DT1 and a first reset NFET RST1. The second flip-flop F2 may include a second data NFET DT2 and a second reset NFET RST2. The first and second data NFETs DT1 and DT2 may correspond to the fourth NFET N4 in FIG. 2, and the first and second reset NFETs RST1 and RST2 may correspond to the fifth NFET N5 in FIG. 2.

The first and second reset NFETs RST1 and RST2 may be electrically connected to each other through a fifth node ND5. Drain terminals of first and second reset NFETs RST1 and RST2 may be shared with each other through the fifth node ND5. Thus, the fifth node ND5 may electrically connect the first data NFET DT1, the first reset NFET RST1, the second data NFET DT2, and the second reset NFET RST2 to one another.

Because the first and second reset NFETs RST1 and RST2 may be electrically connected to each other through the fifth node ND5, the first and second reset NFETs RST1 and RST2 may be connected in parallel to each other, thus reducing a resistance between the fifth node ND5 and a ground terminal.

The multiplexers 11 and the latch circuits 12 included in the first flip-flop F1 and the second flip-flop F2 may be arranged as described above with reference to FIG. 7. A layout of the fifth node ND5 is described with reference to FIG. 10, based on the above.

Figure 10:
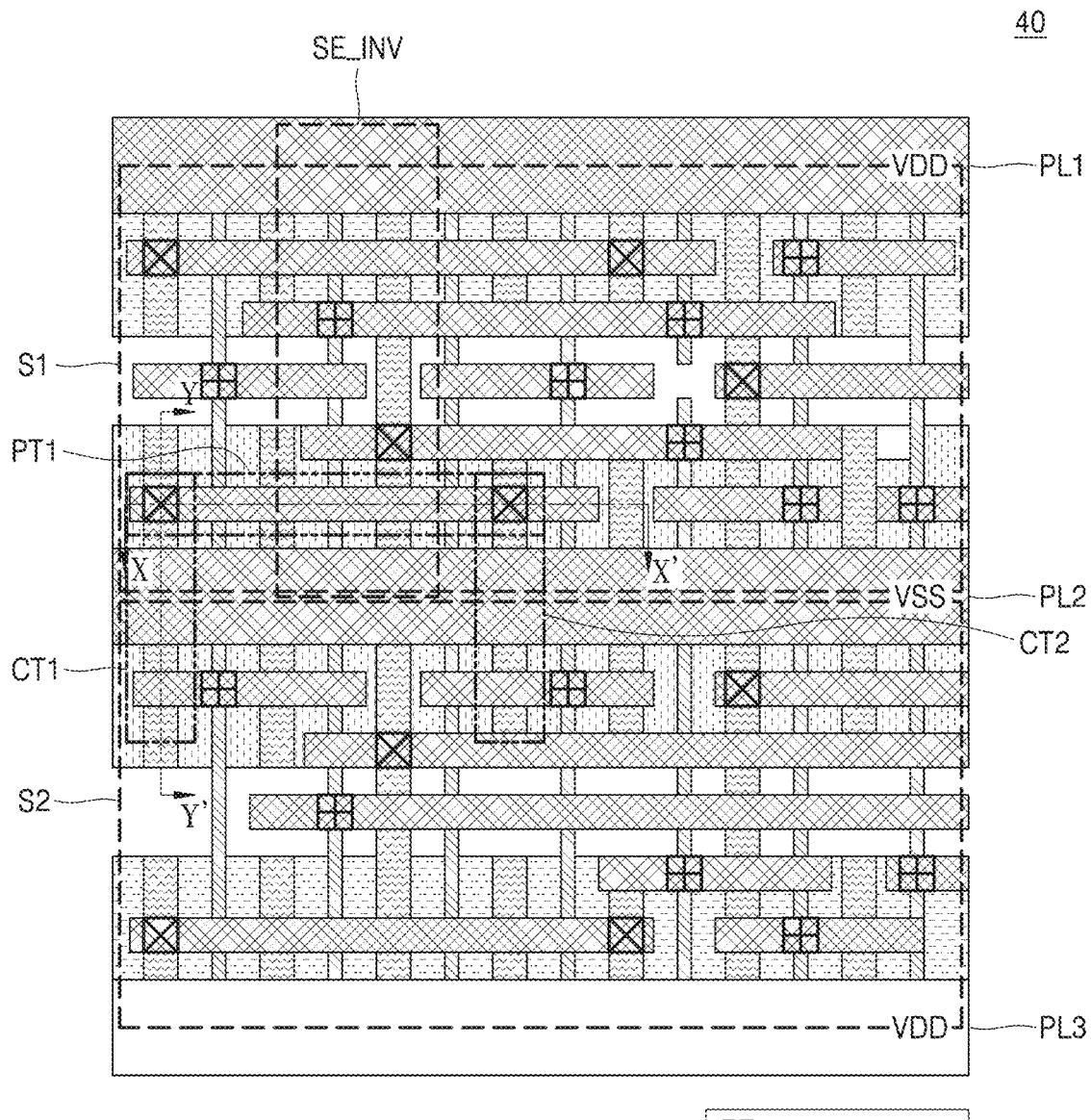
FIG. 10 is a cross-sectional view illustrating a line layer according to some example embodiments of inventive concepts.

FIG. 10 is a layout diagram illustrating a flip-flop cell according to some example embodiments of inventive concepts. For example, FIG. 10 is layout corresponding to the schematic of FIG. 9 and a plan view that shows a layout of the first and second selection blocks S1 and S2, which is described with reference to FIG. 8, on a plane including an x-axis and a y-axis. In the drawings to be described below, for convenience of illustration, only some layers may be shown, and in order to show connection between a pattern of an upper line layer and a lower line layer, a via may be shown even though the via is below a pattern of an upper line layer.

Referring to FIGS. 9 and 10, the first selection block S1 may show a layout of the multiplexer (11 of FIG. 9) included in the first flip-flop (F1 of FIG. 9), and the second selection block S2 may show a layout of the multiplexer (11 of FIG. 9) included in the second flip-flop (F2 of FIG. 9). The first selection block S1 and the second selection block S2 may be arranged adjacent to each other with the second power line PL2 between the first selection block S1 and the second selection block S2. The first and second reset NFETs RST1 and RST2 respectively included in the first and second selection blocks S1 and S2 may be arranged adjacent to each other with the second power line PL2 therebetween. Each of the first and second reset NFETs (RST1 and RST2 of FIG. 9) may be aligned in the second direction (Y). The first and second data NFETs (DT1 and DT2 of FIG. 9) may be apart in the first direction (X) from the first and second reset NFETs (RST1 and RST2 of FIG. 9) and be aligned in the second direction (Y).

An integrated circuit 40 may include a first contact CT1 crossing the second power line PL2 and extending in the second direction (Y). The first contact CT1 may electrically connect the first and second reset NFETs (RST1 and RST2 of FIG. 9) to each other. In some example embodiments, the first contact CT1 may be connected to drain terminals of the first and second reset NFETs (RST1 and RST2 of FIG. 9).

The integrated circuit 40 may include a second contact CT2 crossing the second power line PL2 and extending in the second direction (Y). The second contact CT2 may be arranged apart in the first direction (X) from the first contact CT1. The second contact CT2 may electrically connect the first and second data NFETs (DT1 and DT2 of FIG. 9) to each other. In some example embodiment, the second contact CT2 may be connected to source terminals of the first and second data NFETs (DT1 and DT2 of FIG. 9). The first contact CT1 and the second contact CT2 may be provided by using a source/drain contact CA.

The integrated circuit 40 may include a first pattern PT1 electrically connected to the first contact CT1 and the second contact CT2 and extending in the first direction. For example, either or both of the first contact CT1 and the second contact CT2 may be bar contacts/local interconnect contacts. The first pattern PT1 may electrically connect the first data NFET (DT1 of FIG. 9) and the first reset NFET (RST1 of FIG. 9) to each other. The first pattern PT1 may connect the drain terminal of the first reset NFET (RST1 of FIG. 9) and the source terminal of the first data NFET (DT1 of FIG. 9) to each other. The first pattern PT1 may be provided by using a line provided on the same layer as a layer on which the second power line PL2 is arranged. The first pattern PT1 may be provided by using a metal line such as at least one of an aluminum line, a copper, line, a polysilicon line, or a tungsten line. The fifth node ND5 may be provided by using the first contact CT1, the first pattern PT1, and the second contact CT2. In some example embodiments, the first pattern PT1 is included in the first selection block S1, but example embodiments are not limited thereto. For example, the first pattern PT1 may be included in the second selection block S2.

The source/drain contact CA provided on a layer lower than a layer on which the second power line PL2 is arranged is used in the fifth node ND5 according to some example embodiments of inventive concepts, and thus, routing may be facilitated in a subsequent process. Also, as the fifth node ND5 is formed using the source/drain contact CA formed in a layer lower than the second power line PL2, the metal wiring layer may have a lower height. A structure and effect of the fifth node ND5 are described below with reference to FIGS. 11 to 13.

Figure 11:
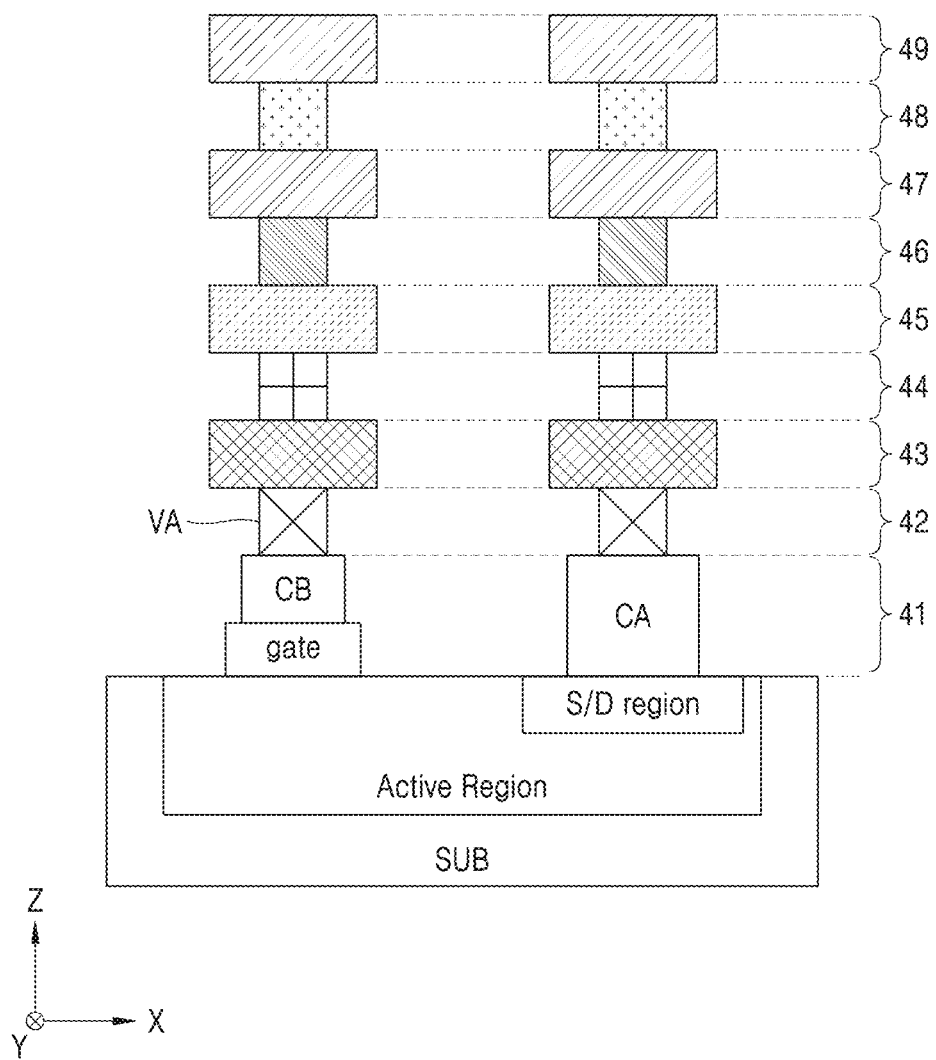
FIG. 11 is a layout diagram illustrating a flip-flop cell according to some example embodiments of inventive concepts.

FIG. 11 is a cross-sectional view illustrating a plurality of layers, for example, first to ninth layers 41 to 49, provided above a substrate SUB according to some example embodiments of inventive concepts.

Referring to FIG. 11, the first to ninth layers 41 to 49 may be provided above the substrate SUB. A cell may be provided on the substrate SUB, and the cell may include the first flip-flop cell FF1 or the second flip-flop cell FF2 described above with reference to FIG. 7. However, example embodiments are not limited thereto. In addition, FIG. 11 is merely a cross-sectional view illustrating the first to ninth layers 41 to 49 above the substrate SUB and may be different from a cross-sectional view of an actual standard cell.

The first layer 41 may be referred to as a contact layer, and a gate contact CB connected to a gate electrode of a transistor and a source/drain contact CA connected to a source/drain (S/D) region of the transistor may be provided on the first layer 41. The first layer 41 may be referred to as M0, and a cell and the first layer 41 may be provided in a front-end-of-line (FEOL) process.

As used herein, the second layer 42 may be referred to as a contact via layer and may also be referred to as V0. The third layer 43 may be referred to as a first line layer. The fourth layer 44 may be referred to as a first via layer V1. The fifth layer 45 may be referred to as a second line layer M2. The sixth layer 46 may be referred to as a second via layer V2. The seventh layer 47 may be referred to as a third line layer M3. The eighth layer 48 may be referred to as a third via layer V3. The ninth layer 49 may be referred to as a fourth line layer M4. A contact area may decrease from the second layer 42 toward the ninth layer 49. The second to ninth layers 42 to 49 may be provided in a back end of line (BEOL) process.

Referring to FIGS. 10 and 11, the first contact CT1 and the second contact CT2 may be provided by using the S/D contact CA provided on the first layer 41. The first pattern PT1 may be provided by using a line provided on the third layer 43. The first contact CT1 and the second contact CT2 may be connected to the first pattern PT1 through a via provided in the second layer 42.

According to some example embodiments of inventive concepts, the fifth node ND5 may include vias and lines on lower layers among the second to ninth layers 42 to 49 by using the S/D contact CA, thus improving the complexity of lines provided on line layers. In addition, because the fifth node ND5 includes vias and lines provided on lower layers, routing may be performed over a relatively large area in a subsequent process. Thus, process defects may be improved, and it may be advantageous for targeting of an output pin.

Figure 12:
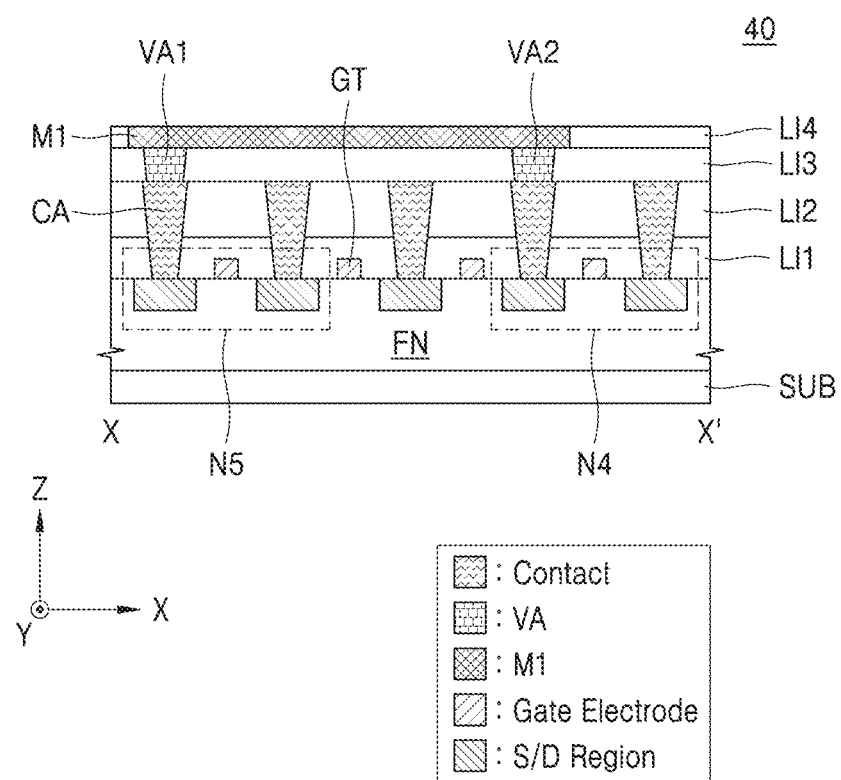
FIG. 12 is a cross-sectional view illustrating a flip-flop cell according to some example embodiments of inventive concepts.
Figure 13:
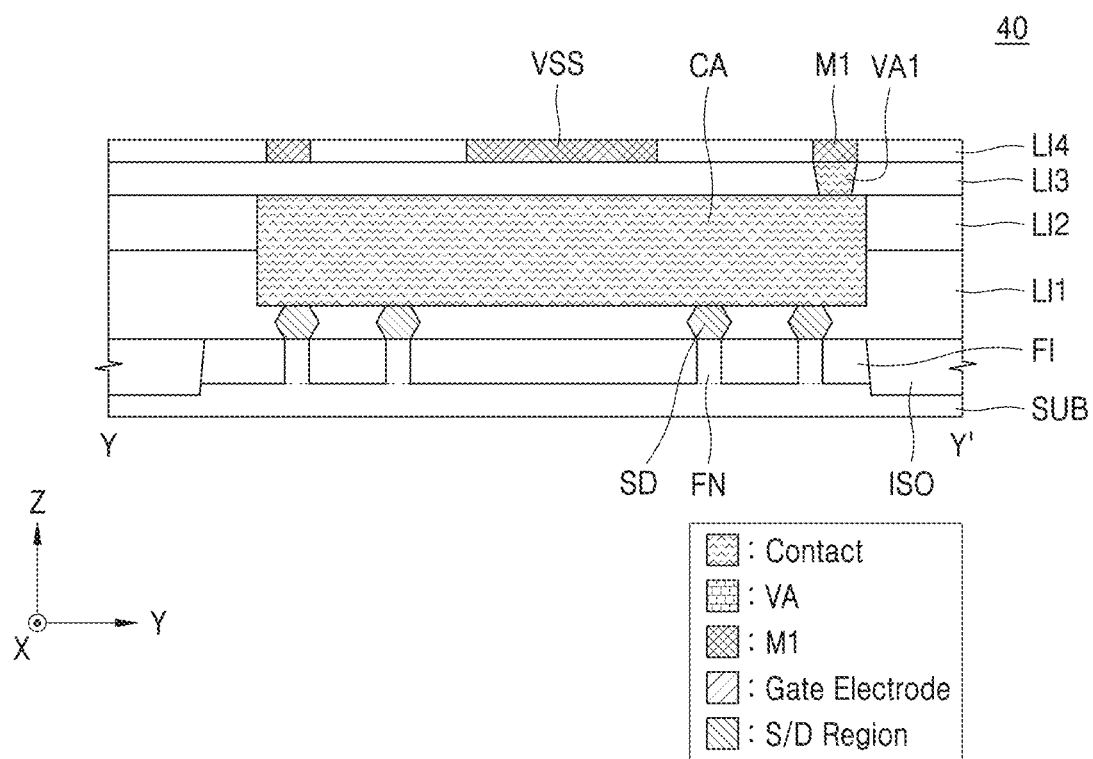
FIG. 13 is a cross-sectional view illustrating a flip-flop cell according to some example embodiments of inventive concepts.

FIGS. 12 and 13 are cross-sectional views illustrating an example of a cell structure according to some example embodiments of inventive concepts. Specifically, FIG. 12 is a cross-sectional view illustrating the first pattern PT1 in FIG. 10 taken along line X-X' in FIG. 10, and FIG. 13 is a cross-sectional view illustrating the first contact CT1 in FIG. 10 taken along line Y-Y' in FIG. 10.

For convenience of description of FIGS. 12 and 13, some elements may be omitted. For example, gate spacers may be provided on side surfaces of a gate electrode, and a gate dielectric layer may be provided between the gate electrode and the gate spacers and on a lower surface of the gate electrode. In addition, FIGS. 12 and 13 show FINFETs as an example, but example embodiments are not limited thereto, and may be implemented with various transistors as described above. FIGS. 12 and 13 are described below with reference to FIG. 10, and redundant descriptions thereof are omitted.

Referring to FIG. 12, a fin FN may extend in an X direction on a substrate SUB, and an S/D region SD may be provided in the fin FN. First to fourth interlayer insulating layers LI1 to LI4 may be provided on the fin FN. The S/D region SD together with a gate electrode GT may be included in a transistor. In some example embodiments embodiment, a transistor arranged at an edge on the X side of line X-X' may include the fifth NFET N5, and a transistor arranged at an edge on the X' side may include the fourth NFET N4.

The S/D contact CA may be connected to the S/D region SD through the second interlayer insulating layer LI2. First and second S/D vias VA1 and VA2 may be connected to the S/D contact CA through the third interlayer insulating layer LI3. A line M1 may extend in the first direction and be connected to the first and second source/drain vias VA1 and VA2 through the fourth interlayer insulating layer LI4. Thus, the S/D region SD of the fifth NFET N5 and the S/D region SD of the fourth NFET N4 may be electrically connected to each other.

Referring to FIG. 13, a field insulating layer FI may be provided above the substrate SUB. The field insulating layer FI may surround a portion of side surfaces of the fin FN. The first to fourth interlayer insulating layers LI1 to LI4 may be provided above the field insulating layer FI. The fins FN may each extend in an x-axis direction from the field insulating layer FI, and the S/D region SD may be provided above the fin FN. A device separation layer ISO may extend in the x-axis direction between the fins FN.

The S/D contact CA may be connected to the S/D contacts CA through the first and second interlayer insulating layers LI1 and LI2 and accordingly, the S/D contacts CA may be electrically connected to each other. The first S/D via VA1 may be connected to the S/D contact CA through the third interlayer insulating layer LI3, and the line M1 may be connected to the first S/D via VA1 through the fourth interlayer insulating layer LI4. Accordingly, the S/D contact CA and the line M1 may be electrically connected to each other and thus, may electrically connect the first selection block S1 to the fifth NFET N5 included in the second selection block S2.

Figure 14:
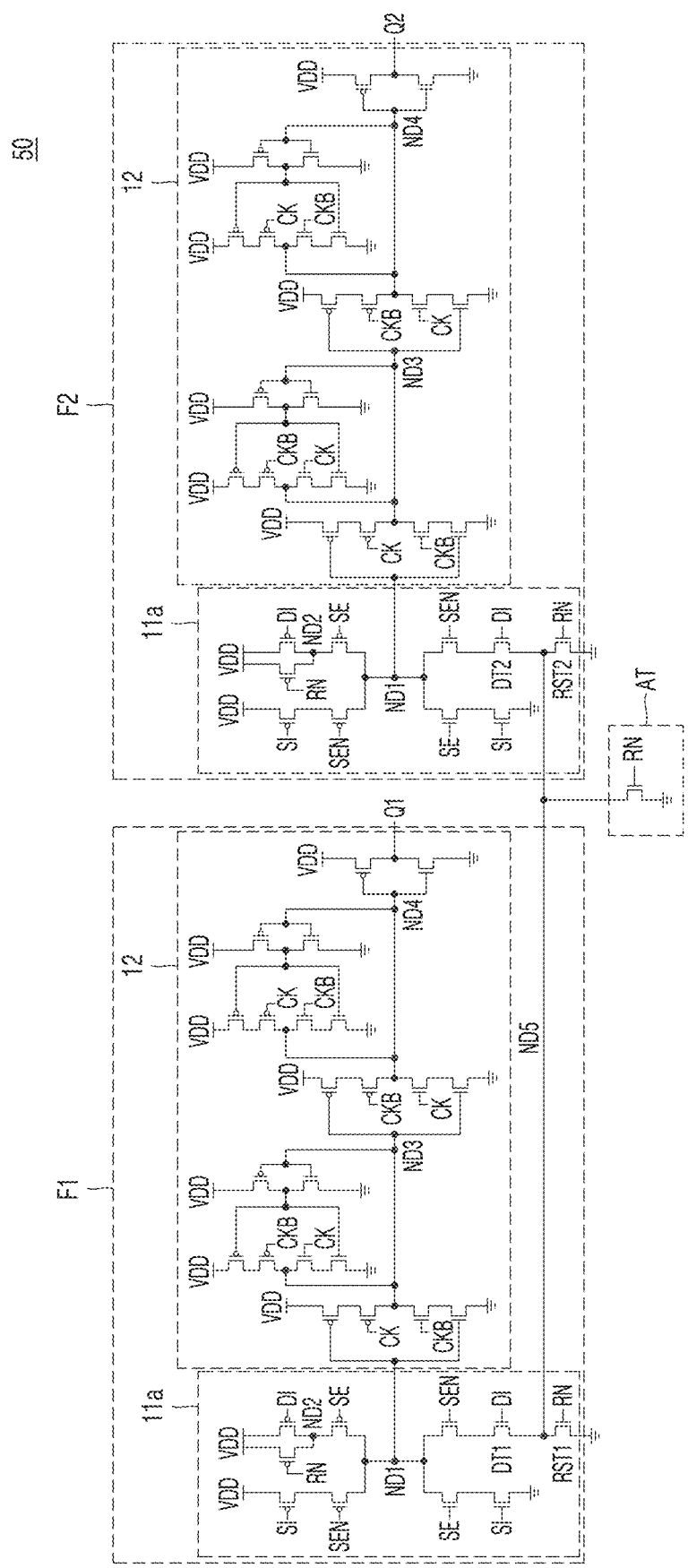
FIG. 14 is a circuit diagram illustrating a flip-flop cell according to some example embodiments of inventive concepts.

FIG. 14 is a circuit diagram of flip-flops according to some example embodiments of inventive concepts. Specifically, FIG. 14 is described below with reference to FIG. 9, and thus, redundant descriptions thereof are omitted.

Referring to FIGS. 9 and 14, an integrated circuit 50 may further include an additional reset NFET AT. The additional reset NFET AT may be connected to the fifth node ND5. For example, the additional reset NFET AT may be connected between the fifth node ND5 and a ground node. Accordingly, the additional reset NFET AT may be connected in parallel to the first and second reset NFETs RST1 and RST2. In FIG. 13, only one additional reset NFET AT is shown. However, the inventive concept is not limited thereto, and a plurality of additional reset NFETs AT may be provided. When a plurality of additional reset NFETs AT are provided, the plurality of additional reset NFETs AT may be connected in parallel to each other between the fifth node ND5 and the ground node.

In some example embodiments, the integrated circuit 50 further includes the additional reset NFET AT between the fifth node ND5 and the ground node, to thereby reduce a resistance between the fifth node ND5 and the ground node. The multiplexer 11a included in each of the first flip-flop F1 and the second flip-flop F2 may be arranged as described above with reference to FIG. 10, and a layout of the additional reset NFET AT in FIG. 15 is described with reference to the above.

Figure 15:
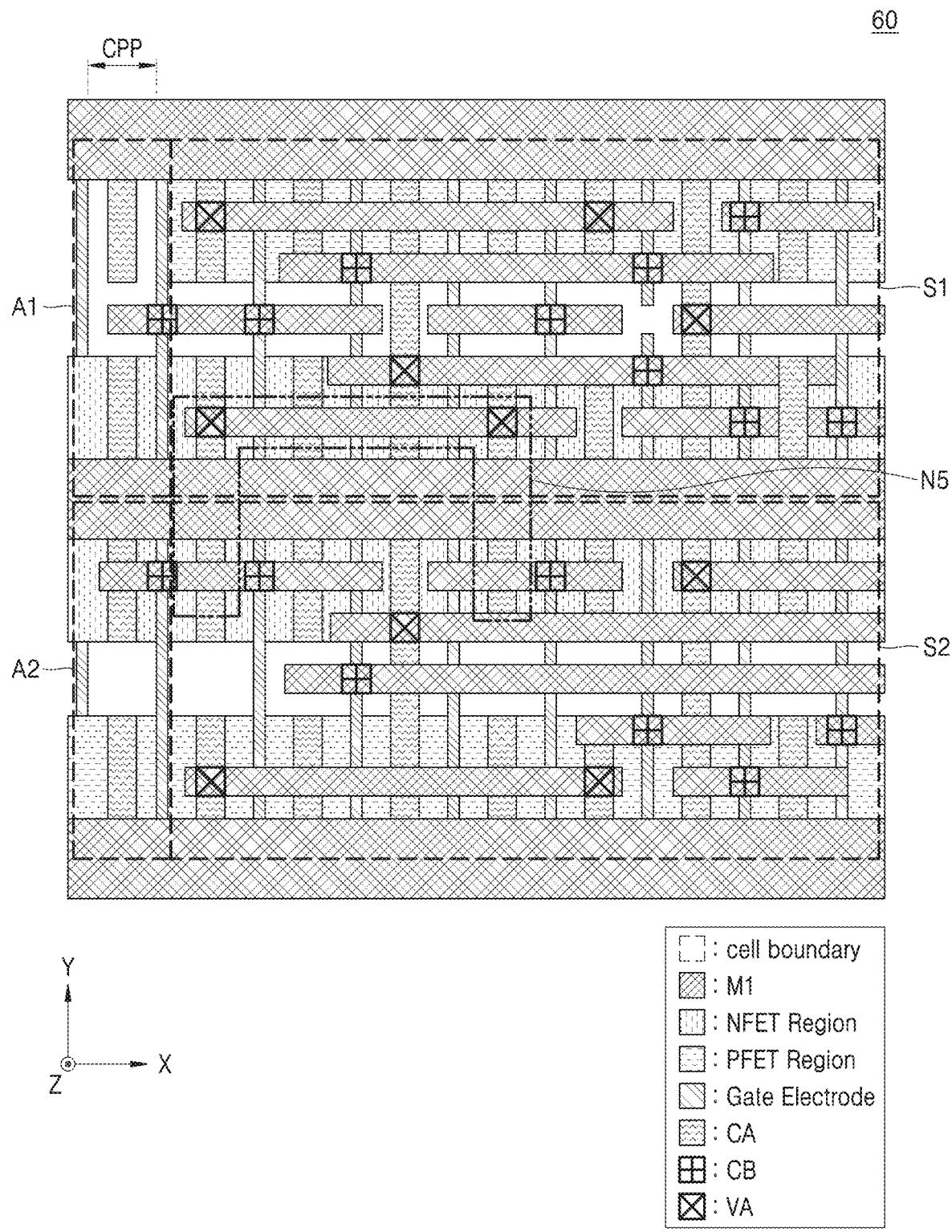
FIG. 15 is a layout diagram illustrating a flip-flop cell according to some example embodiments of inventive concepts.

FIG. 15 is a layout diagram illustrating a flip-flop cell according to some example embodiments of inventive concepts. Specifically, FIG. 15 is a diagram illustrating a layout of the additional reset NFET AT in FIG. 14 and described with reference to FIGS. 10 and 14.

Referring to FIG. 15, an integrated circuit 60 may be provided larger than the integrated circuit 40 shown in FIG. 10 by a pitch CPP of gate electrodes apart from each other in the first direction.

The integrated circuit 60 may further include a first additional block A1 and a second additional block A2. An additional reset NFET AT may be arranged in at least one of the first additional block A1 and the second additional block A2. For example, one additional reset NFET AT may be arranged in each of the first additional block A1 and the second additional block A2, and the additional reset NFET AT may be arranged in either one of the first additional block A1 and the second additional block A2.

The first additional block A1 and the second additional block A2 may be connected to the fifth node ND5 including the first contact CT1. The additional reset NFET AT included in at least one of the first additional block A1 and the second additional block A2 may be electrically connected through the fifth node ND5 to the first and second reset NFETs RST1 and RST2 respectively included in the first and second selection blocks S1 and S2. The first and second additional blocks A1 and A2 may be electrically connected to the first and second selection blocks S1 and S2, respectively, through the first contact CT1 included in the fifth node ND5. Accordingly, the additional reset NFET AT may be connected in parallel to the first and second reset NFETs RST1 and RST2.

Figure 16:
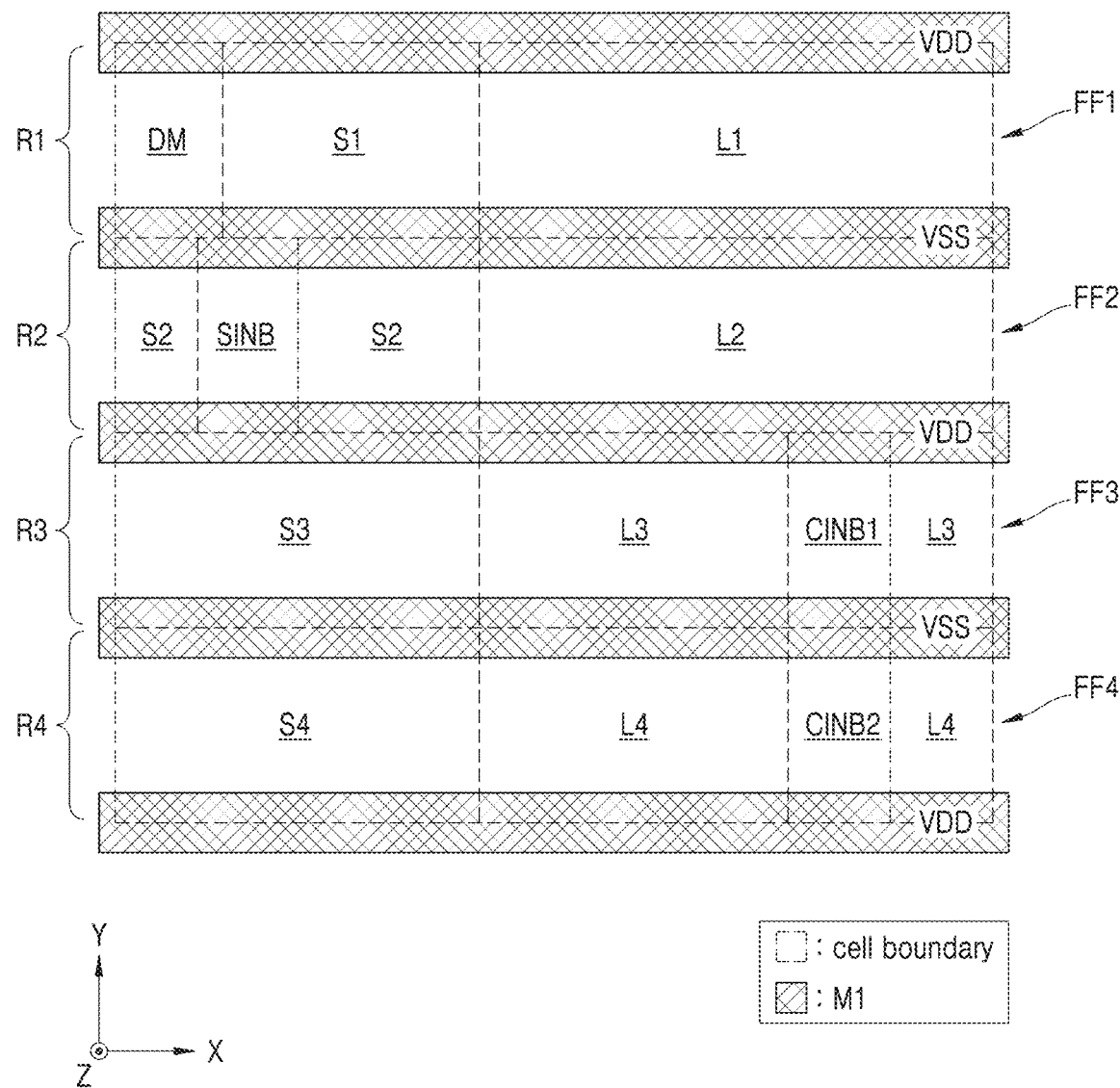
FIG. 16 is a layout diagram illustrating a flip-flop cell according to some example embodiments of inventive concepts.

FIG. 16 is a diagram illustrating a layout of an integrated circuit 70 according to some example embodiments of inventive concepts. Specifically, FIG. 16 is a plan view of a layout of the integrated circuit 70 including first to fourth flip-flop cells FF1 to FF4. FIG. 16 is described with reference to FIG. 8.

Referring to FIG. 16, the integrated circuit 70 may include the first to fourth flip-flop cells FF1 to FF4 respectively arranged in first to fourth rows R1 to R4. The first to fourth flip-flop cells FF1 to FF4 may correspond to the flip-flops 10 and 60 described with reference to FIGS. 1 and 15.

The first flip-flop cell FF1 may include the first selection block S1 and the first latch block L1, the second flip-flop cell FF2 may include the second selection block S2 and the second latch block L2, the third flip-flop cell FF3 may include the third selection block S3 and the third latch block L3, and the fourth flip-flop cell FF4 may include the fourth selection block S4 and the fourth latch blocks L4. The first to fourth selection blocks S1 to S4 may receive a scan enable signal, a data input signal, a scan input signal, and a reset input signal and generate one output signal, and the first to fourth latch blocks L1 to L4 may latch output signals of the first to fourth selection blocks S1 to S4 and generate a final output signal.

The integrated circuit 70 may include a scan inverter block SINB, a first clock inverter block CINB1, and a second clock inverter block CINB2. The first clock inverter block CINB1 and the second clock inverter block CINB2 may include the same configuration. The scan inverter block SINB may have a layout corresponding to the scan inverter SINV described above with reference to FIG. 5, and the first clock inverter block CINB1 and the second clock inverter block CINB2 may each have a layout corresponding to the clock inverter CINV described above with reference to FIG. 6.

The first to fourth flip-flop cells FF1 to FF4 may share the scan inverter block SINB with each other. In other words, the first to fourth flip-flop cells FF1 to FF4 may commonly receive an output signal from the scan inverter block SINB. The first and second flip-flop cells FF1 and FF2 may share the first clock inverter block CINB1 with each other, and the third and fourth flip-flop cells FF3 and FF4 may share the second clock inverter block CINB2 with each other. For example, the first and second flip-flop cells FF1 and FF2 may commonly receive an output signal of the first clock inverter block CINB1, and the third and fourth flip-flop cells FF3 and FF4 may receive an output signal of the second clock inverter block CINB2.

The scan inverter block SINB, the first clock inverter block CINB1, and the second clock inverter block CINB2 may be arranged in the first to fourth rows R1 to R4. At least two of the scan inverter block SINB, the first clock inverter block CINB1, and the second clock inverter block CINB2 may be arranged in other rows. For example, the scan inverter block SINB may be arranged in the second row R2, the first clock inverter block CINB1 may be arranged in the third row R3, and the second clock inverter block CINB2 may be arranged in the fourth row R4. In some example embodiments, the first clock inverter block CINB1 and the second clock inverter block CINB2 may be arranged in the same row, and the scan inverter block SINB may be arranged in a different row. Each of the scan inverter block SINB, the first clock inverter block CINB1, and the second clock inverter block CINB2 may be inserted into the first to fourth selection blocks S1 to S4 and the first to fourth latch blocks L1 to L4. In some example embodiments, each of the scan inverter block SINB, the first clock inverter block CINB1, and the second clock inverter block CINB2 may be arranged between the first to fourth selection blocks S1 to S4 and the first to fourth latch blocks L1 to L4. As described above, the scan inverter block SINB, the first clock inverter block CINB1, and the second clock inverter block CINB2 may be variously arranged.

As the scan inverter block SINB, the first clock inverter block CINB1, or the second clock inverter block CINB2 are arranged in at least two of the first to fourth rows R1 to R4, a dummy region DM may be provided in the integrated circuit 70. For example, when the scan inverter block SINB is arranged in the second row R2, the first clock inverter block CINB1 is arranged in the third row R3, and the second clock inverter block CINB2 is arranged in the fourth row R4, the dummy region DM may be provided in the first row RE The dummy region DM may refer to a block not having a transistor or not having a transistor that is electrically connected/electrically active arranged therein. A position of the dummy region DM is not limited to that of FIG. 16, and one or more dummy regions DM may be provided, and may be provided at various positions.

When FIG. 16 is described with reference to FIG. 14, the additional reset NFET AT may be arranged in the dummy region DM. When a plurality of dummy regions DM are provided in the integrated circuit 70, a plurality of additional reset NFETs AT may be arranged in the plurality of dummy regions DM. Accordingly, because transistors may be additionally provided while maintaining a size of the integrated circuit 70, a semiconductor device having a small size may be provided.

Figure 17:
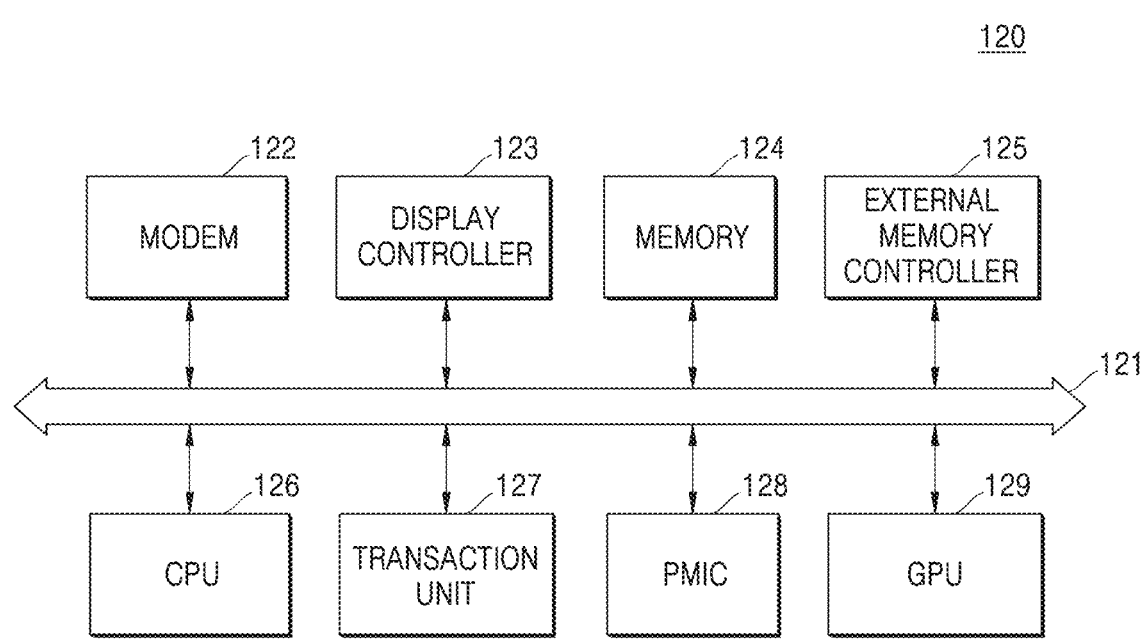
FIG. 17 is a block diagram of a system-on-chip (SoC) according to some example embodiments of inventive concepts.

FIG. 17 is a block diagram illustrating a system-on-chip (SoC) 120 according to some example embodiments of inventive concepts. The SoC 120 is a semiconductor device and may include an integrated circuit according to some example embodiments of inventive concepts. The SoC 120 implements complex functional blocks such as intellectual property (IP) that performs various functions in one chip, and a flip-flop cell provided according to example embodiments of the inventive concept may be included in each of the functional blocks of the SoC 120. Accordingly, the SoC 120 having improved routing complexity may be provided.

Referring to FIG. 17, the SoC 120 may include a modem 122, a display controller 123, a memory 124, an external memory controller 125, a central processing unit (CPU) 126, a transaction unit 127, a power management integrated circuit (PMIC) 128, and a graphics processing unit (GPU) 129, and each of the functional blocks of the SoC 120 may communicate with each other through a system bus 121.

The CPU 126, which is capable of control overall operations of the SoC 120, may control operations of other function blocks, for example, the modem 122, the display controller 123, the memory 124, the external memory controller 125, the transaction unit 127, the PMIC 128, and the GPU 129. The modem 122 may demodulate a signal received from the outside of the SoC 120 or may modulate a signal generated within the SoC 120 and transmit the modulated signal to the outside. The external memory controller 125 may control an operation of transmitting and receiving data to and from an external memory device connected to the SoC 120. For example, a program and/or data stored in an external memory device may be provided to the CPU 126 or the GPU 129 under the control of the external memory controller 125. The GPU 129 may execute program instructions related to graphics processing. The GPU 129 may receive graphic data through the external memory controller 125 or may transmit graphic data processed by the GPU 129 to the outside of the SoC 120 through the external memory controller 125. The transaction unit 127 may monitor data transactions of each of the functional blocks, and the PMIC 128 may control power applied to each of the functional blocks under the control of the transaction unit 127. The display controller 123 may control a display (or a display device) outside of the SoC 120 so that data generated within the SoC 120 is transmitted to the display.

The memory 124 may include a non-volatile memory such as at least one of electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory, or the like, or may include a volatile memory such as at least one of dynamic random access memory (DRAM), static random access memory (SRAM), mobile DRAM, double data rate synchronous dynamic random access memory (SDRAM), low power DDR (LPDDR), SDRAM, graphics DDR (GDDR) SDRAM, Rambus dynamic random access memory (RDRAM), or the like.

Figure 18:
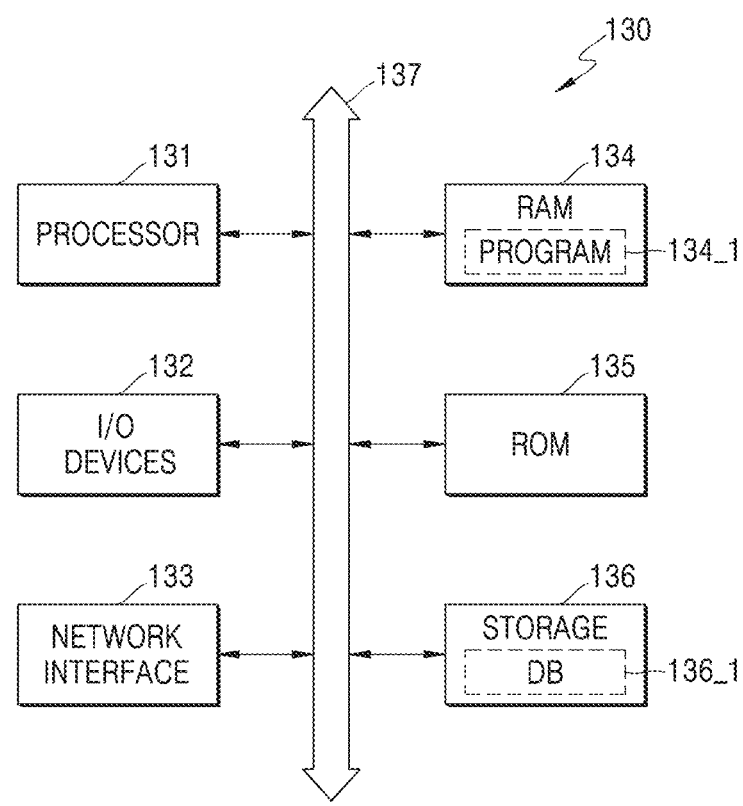
FIG. 18 is a block diagram of a computing system including a memory storing a program, according to some example embodiments of inventive concepts.

FIG. 18 is a block diagram of a computing system 130 including a memory storing a program according to some example embodiments of inventive concepts. At least some of operations included in a method of manufacturing an integrated circuit and operations included in a method of designing an integrated circuit, according to example embodiments of the inventive concept may be performed by the computing system 130.

The computing system 130 may include a fixed computing system such as desktop computers, workstations, servers, or the like, or a portable computing system such as laptop computers or the like.

Referring to FIG. 18, the computing system 130 may include a processor 131, input/output (I/O) devices 132, a network interface 133, a random-access memory (RAM) 134, a read-only memory (ROM) 135, and a storage device 136. The processor 131, the I/O devices 132, the network interface 133, the RAM 134, the ROM 135, and the storage device 136 may be connected to a bus 137 and may communicate with each other through the bus 137.

The processor 131 may be referred to as a processing unit, and, like microprocessors, application processors (APs), digital signal processors (DSPs), and graphics processing units (GPUs), the processor 131 may include at least one core capable of executing any instructions set (for example, Intel Architecture, 32-bit (IA-32), 64-bit extension of IA-32, x86-64, PowerPC, Sparc, Microprocessor without Interlocked Pipelined Stages (MIPS), Advanced reduced instruction set computer (RISC) Machines (ARM), IA-64, etc.). For example, the processor 131 may access a memory, that is, the RAM 134 or the ROM 135, through the bus 137 and execute instructions stored in the RAM 134 or the ROM 135.

The RAM 134 may store a program 134_1 for manufacturing an integrated circuit according to some example embodiments of inventive concepts, or at least a portion thereof, and the program 134_1 may allow the processor 131 to perform at least some of operations included in a method of manufacturing an integrated circuit and operations included in a method of designing an integrated circuit. In other words, the program 134_1 may include a plurality of instructions executable by the processor 131, and the plurality of instructions included in the program 134_1 may allow the program 134_1 to perform some of the instructions.

The storage device 136 may not lose data stored therein, even when power supplied to the computing system 130 is intercepted. For example, the storage device 136 may include a non-volatile memory device or may include a storage medium such as magnetic tapes, optical disks, and magnetic disks. In addition, the storage device 136 may be detachable from the computing system 130. The storage device 136 may store the program 134_1 according to some example embodiments of inventive concepts, and before the program 134_1 is executed by the processor 131, the program 134_1 or at least a portion thereof may be loaded into the RAM 134 from the storage device 136. In another example, the storage device 136 may store a file written in a program language, and the program 134_1 generated by a compiler or the like or at least a portion thereof may be loaded into the RAM 134 from the file. In addition, the storage device 136 may store a database 136_1, which may include information necessary for designing an integrated circuit.

The storage device 136 may store data to be processed by the processor 131 or data that has been processed by the processor 131. For example, the processor 131 may process data stored in the storage device 136 and generate data according to the program 134_1, and store the generated data in the storage device 136.

The I/O devices 132 may include an input device such as keyboards, pointing devices, or the like, and may include an output device such as display devices, printers, or the like. For example, a user may trigger the processor 131 to execute the program 134_1, through the I/O devices 132.

The network interface 133 may provide an access to a network outside of the computing system 130. For example, the network may include a plurality of computing systems and communication links, and the communication links may include wired links, optical links, wireless links, or links in any other forms.

While some example embodiments have been particularly shown and described with reference to embodiments thereof, it will be understood that various changes in form and details may be made therein without departing from the spirit and scope of the following claims. Furthermore example embodiments are not necessary mutually exclusive. For example, some example embodiments may include features described with reference to one or more figures, and may also include features described with reference to one or more other figures.

What is claimed is:

1. An integrated circuit comprising:
    a first flip-flop configured to operate in synchronization with a clock signal, wherein the first flip-flop includes,
    a multiplexer configured to receive a scan enabled signal, a scan input signal, a data input signal, and a reset input signal, the multiplexer configured to output an inverted signal of the scan input signal to a first node based on the scan enable signal, the multiplexer configured to output an inverted signal of the data input signal or a signal having a first level to the first node based on the reset input signal, the multiplexer configured to selectively output the inverted signal of the scan input signal, the inverted signal of the data input signal, or the signal having the first level to the first node based on the reset input signal and the scan enable signal,
    a master latch configured to latch the output signal through the first node, and to output the latched signal, and
    a slave latch configured to latch an output signal of the master latch and to output the latched output signal of the master latch.

2. The integrated circuit of claim 1, further comprising:
    a second flip-flop having same components and connections as the first flip-flop;
    a scan inverter configured to invert the scan enable signal and to output an inverted scan enable signal; and
    a clock inverter configured to invert the clock signal and to output an inverted clock signal,
    wherein the first flip-flop and the second flip-flop are configured to commonly receive the inverted scan enable signal and the inverted clock signal.

3. The integrated circuit of claim 1, wherein the multiplexer includes first and second n-type field-effect transistors (NFETs) connected in series to each other, the first and second NFETs between a ground node and the first node, the first NFET configured to receive the scan enable signal and the second NFET configured to receive the scan input signal.

4. The integrated circuit of claim 3, wherein the multiplexer further includes third to fifth NFETs connected in series to each other, the third to fifth NFETs between the first node and the ground node, the third NFET configured to receive an inverted scan enable signal provided by inverting the scan enable signal, the fourth NFET configured to receive the data input signal, and the fifth NFET configured to receive the reset input signal.

5. The integrated circuit of claim 4, wherein the integrated circuit further comprises:
    a second flip-flop having same components and connections as the first flip-flop,
    wherein the fifth NFETs included in the first flip-flop and the second flip-flop are connected in parallel to each other between a fifth node and the ground node.

6. The integrated circuit of claim 5, wherein the integrated circuit further comprises:
    a sixth NFET connected between the fifth node and the ground node, and configured to receive the reset input signal through a gate terminal.

7. The integrated circuit of claim 1, wherein the multiplexer includes first and second p-type field-effect transistors (PFETs) connected in series to each other, the first and second PFETs being between a power node and the first node, the first PFET configured to receive the scan input signal and the second PFET configured to receive an inverted scan enable signal.

8. The integrated circuit of claim 7, wherein the multiplexer includes,
    a third PFET connected to a second node and the first node and configured to receive the scan enable signal; and
    fourth and fifth PFETs connected in parallel to each other between the power node and the second node, the fourth PFET configured to receive the data input signal and fifth PFET configured to receive the reset input signal.

9. The integrated circuit of claim 1, wherein the multiplexer is configured to output the signal having the first level in response to the scan enable signal being a first logic level and the reset input signal being the first logic level.

10. The integrated circuit of claim 9, wherein the multiplexer is further configured to output the inverted signal of the scan input signal in response to the scan enable signal being a second logic level.

11. The integrated circuit of claim 10, wherein the multiplexer is further configured to output the inverted signal of the data input signal in response to the scan enable signal being the first logic level and the reset input signal being the second logic level.

12. The integrated circuit of claim 10, wherein the multiplexer is further configured to output the inverted signal of the scan input signal in response to the scan enable signal being the second logic level regardless of a logic level of the reset input signal.

13. An integrated circuit comprising:
    a first flip-flop configured to operate in synchronization with a clock signal, wherein the first flip-flop includes,
    a multiplexer configured to output an inverted signal of a scan input signal to a first node based on a scan enable signal, the multiplexer configured to output an inverted signal of a data input signal a signal having a first level to the first node based on a reset input signal,
    a master latch configured to latch the output signal through the first node, and to output the latched signal, and
    a slave latch configured to latch an output signal of the master latch and to output the latched output signal of the master latch, wherein the multiplexer comprises:

first and second n-type field-effect transistors (NFETs) connected in series to each other, the first and second NFETs between a ground node and the first node, the first NFET configured to receive the scan enable signal and the second NFET configured to receive the scan input signal; and third to fifth NFETs connected in series to each other, the third to fifth NFETs between the first node and the ground node, the third NFET configured to receive an inverted scan enable signal provided by inverting the scan enable signal, the fourth NFET configured to receive the data input signal, and the fifth NFET configured to receive the reset input signal.

14. The integrated circuit of claim 13, wherein the multiplexer comprises:

first and second p-type field-effect transistors (PFETs) connected in series to each other, the first and second PFETs being between a power node and the first node, the first PFET configured to receive the scan input signal and the second PFET configured to receive the inverted scan enable signal;

a third PFET connected to a second node and the first node and configured to receive the scan enable signal; and fourth and fifth PFETs connected in parallel to each other between the power node and the second node, the fourth PFET configured to receive the data input signal and fifth PFET configured to receive the reset input signal.

15. The integrated circuit of claim 13, further comprising:

a second flip-flop having same components and connections as the first flip-flop, wherein the fifth NFETs included in the first flip-flop and the second flip-flop are connected in parallel to each other between a fifth node and the ground node.

16. The integrated circuit of claim 15, further comprising:

a sixth NFET connected between the fifth node and the ground node, and configured to receive the reset input signal through a gate terminal.

* * * * *